(12) United States Patent
Konishi et al.

(10) Patent No.: US 10,744,963 B2
(45) Date of Patent: Aug. 18, 2020

(54) CHARGE/DISCHARGE DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Rina Konishi, Mie (JP); Takafumi Kawakami, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 216 days.

(21) Appl. No.: 15/775,920

(22) PCT Filed: Oct. 27, 2016

(86) PCT No.: PCT/JP2016/081795
§ 371 (c)(1),
(2) Date: May 14, 2018

(87) PCT Pub. No.: WO2017/086110
PCT Pub. Date: May 26, 2017

(65) Prior Publication Data
US 2018/0326925 A1 Nov. 15, 2018

(30) Foreign Application Priority Data
Nov. 17, 2015 (JP) .................................. 2015-224412

(51) Int. Cl.
*B60R 16/02* (2006.01)
*G01R 31/327* (2006.01)
(Continued)

(52) U.S. Cl.
CPC .......... *B60R 16/02* (2013.01); *G01R 31/3278* (2013.01); *G01R 31/50* (2020.01);
(Continued)

(58) Field of Classification Search
CPC ......... B60R 16/02; G01R 31/50; H02J 7/1461
(Continued)

(56) References Cited

U.S. PATENT DOCUMENTS 4,937,703 A * 6/1990 Adams ..................... H01H 9/56
361/160
5,568,025 A * 10/1996 Sumida ................ H02H 7/0844
318/280
(Continued)

FOREIGN PATENT DOCUMENTS

JP 2006-322362 A 11/2006
WO 2014/208028 A1 12/2014

OTHER PUBLICATIONS

Search Report for PCT/JP2016/081795, dated Dec. 20, 2016.

*Primary Examiner* — Richard V Muralidar
(74) *Attorney, Agent, or Firm* — Honigman LLP

(57) ABSTRACT

A charge/discharge device switches between allowing and disallowing charging/discharging of an electrical storage unit by switching a relay with a drive circuit. The device, specifies at the time of an anomaly that prevents the relay from operating normally, the portion in which the anomaly has occurred. A charge/discharge circuit performs a charge or discharge operation on an electrical storage cell in response to instructions. A drive circuit generates a drive current where a drive instruction is given, and supplies the drive current to a relay. A control unit controls the instructions that are given to the charge/discharge circuit and instruction that is given to the drive circuit. An anomaly specification unit specifies the portion where an anomaly has occurred based on the power source voltage that is input to (Continued)

the drive circuit, output that is provided from the drive circuit to the relay, and the voltage of a charge/discharge path.

6 Claims, 10 Drawing Sheets

(51) Int. Cl.
  *H01M 10/46* (2006.01)
  *H02J 7/14* (2006.01)
  *G01R 31/50* (2020.01)
  *H02J 7/00* (2006.01)
  *H02H 7/18* (2006.01)
  *G01R 31/00* (2006.01)
  *H01M 10/0525* (2010.01)

(52) U.S. Cl.
  CPC ........... *H01M 10/46* (2013.01); *H02J 7/0068* (2013.01); *H02J 7/1461* (2013.01); *G01R 31/006* (2013.01); *H01M 10/0525* (2013.01); *H02H 7/18* (2013.01); *H02J 7/007* (2013.01); *H02J 7/0031* (2013.01)

(58) Field of Classification Search
  USPC .......................... 361/160; 324/418; 320/128
  See application file for complete search history.

(56) References Cited

U.S. PATENT DOCUMENTS

| | | | |
|---|---|---|---|
| 5,828,540 A * | 10/1998 | Marmonier | H01H 9/167 361/195 |
| 8,339,761 B2 * | 12/2012 | Yamada | H01H 47/002 361/160 |
| 8,341,508 B2 * | 12/2012 | Yamada | H04L 1/22 714/794 |
| 2013/0214592 A1 | 8/2013 | Aragai et al. | |
| 2014/0042828 A1 | 2/2014 | Itagaki et al. | |
| 2016/0099591 A1* | 4/2016 | Lee | H02J 7/007 320/162 |

* cited by examiner

AT NORMAL TIME
TRUTH TABLE

| RELAY PROTECTION | RESET DRIVE | COIL VOLTAGE | COIL CURRENT |
|---|---|---|---|
| H | L | L | L |
| L | H | L | L |

CHARGE/DISCHARGE DEVICE

TECHNICAL FIELD

The present invention relates to a charge/discharge device.

BACKGROUND ART

In the field of in-vehicle electronic devices and the like, configurations that switch the state of power supply using a relay have been variously proposed. With configurations using a relay, there are cases where it is desired to check whether the relay is operating without anomaly, and circuits incorporating a mechanism for performing anomaly judgment of the relay have also been provided in response to such demands. Note that this type of technology is disclosed in Patent Document 1, for example.

CITATION LIST

Patent Documents

Patent Document 1: JP 2006-322362A

SUMMARY OF INVENTION

Technical Problem

Incidentally, as one type of in-vehicle electronic device, a charge/discharge device that controls charging and discharging of an electrical storage unit using a predetermined charge/discharge circuit is also envisaged. With this type of charge/discharge device, a relay for separating the charge/discharge circuit and the electrical storage unit, for example, can also be provided, and, by providing such a relay, it becomes possible to use the relay to switch between allowing and disallowing charging/discharging of the electrical storage unit.

Even with such devices, it is desirable to incorporate a technology for determining whether the relay is operating normally, although with a conventional determination method, it is only possible to determine whether the relay is operating normally, and in the case where it is determined that the relay is not operating normally, the location of the anomaly cannot be accurately specified.

The present invention was made based on the foregoing circumstances, and an object thereof is to provide a charge/discharge device that is able to switch between allowing and disallowing charging/discharging of an electrical storage unit by switching a relay with a drive circuit, and is capable of specifying, at the time of an anomaly that prevents the relay from operating normally, the portion in which the anomaly has occurred.

Solution to Problem

A charge/discharge device of the present invention includes a charge/discharge circuit connected to a circuit that includes an electrical storage unit and a relay that is connected to the electrical storage unit and switches between an ON state and an OFF state that respectively allow and disallow charging/discharging of the electrical storage unit, the relay switching between the OFF state and the ON state in response to a drive current being provided, and configured to perform a charge operation for charging the electrical storage unit in response to a charge instruction and a discharge operation for discharging the electrical storage unit in response to a discharge instruction, a drive circuit having a configuration to which a power source voltage is input, and configured to generate the drive current based on the power source voltage in a case where a predetermined drive instruction is given, and to supply the drive current to the relay, a control unit configured to control the charge instruction and the discharge instruction that are given to the charge/discharge circuit and the drive instruction that is given to the drive circuit, and an anomaly specification unit configured to specify a portion in which an anomaly has occurred based on the power source voltage that is input to the drive circuit, output that is provided to the relay from the drive circuit, and a voltage of a charge/discharge path that is interposed between the charge/discharge circuit and the electrical storage unit.

Advantageous Effects of Invention

In the present invention, combination of a power source voltage that is input to a drive circuit, output that is provided to a relay from the drive circuit, and a voltage of a charge/discharge path that is interposed between a charge/discharge circuit and an electrical storage unit are in a relationship that changes due to an anomaly occurring in a portion thereof. Therefore, if an anomaly specification unit is provided and configured to specify the portion in which the anomaly has occurred after having grasped the state of these variables, the portion in which the anomaly has occurred can be more specifically narrowed down and specified.

DESCRIPTION OF EMBODIMENTS

Figure 1:
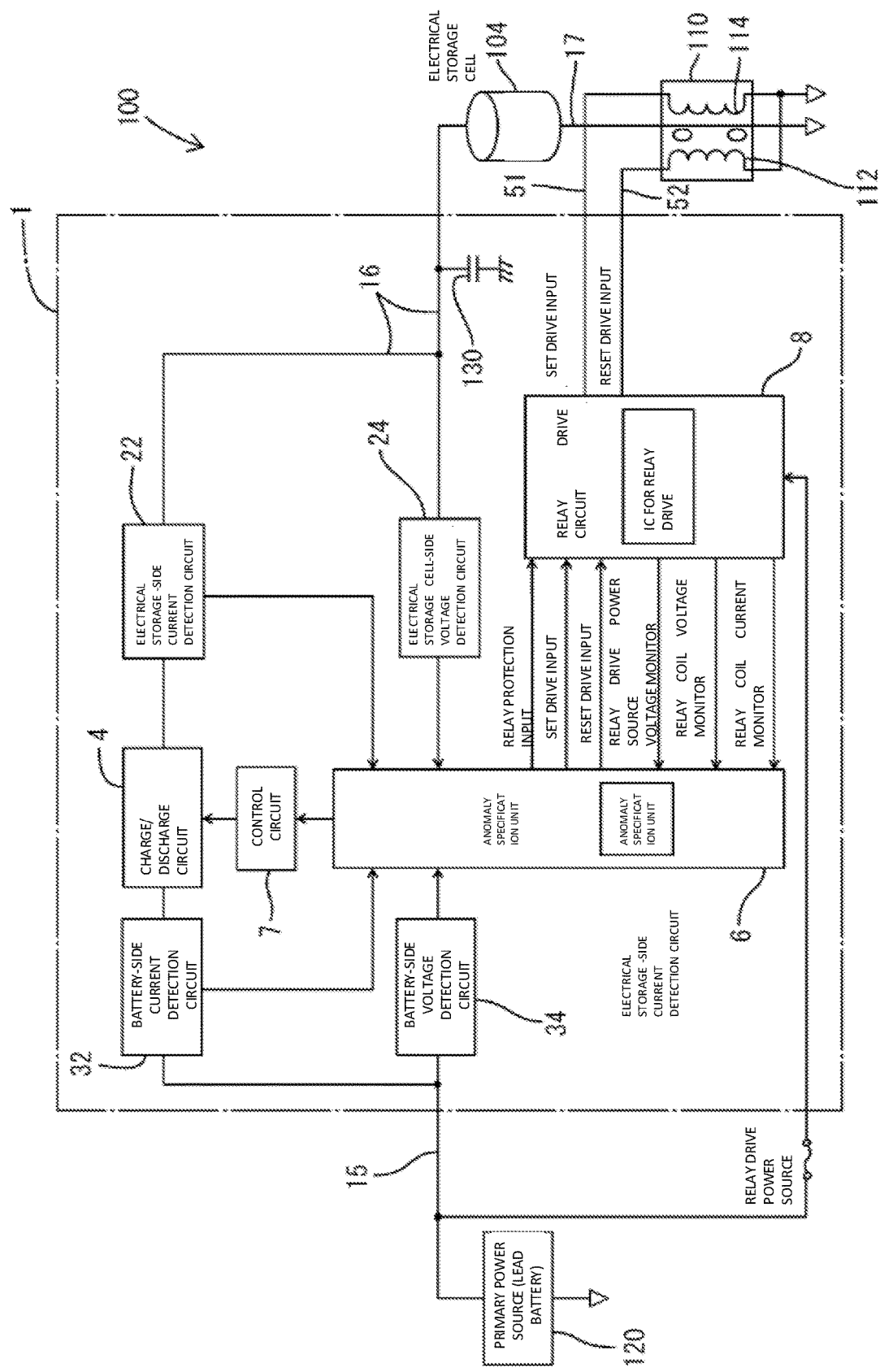
FIG. 1 is a block diagram illustrating an in-vehicle charge/discharge system that uses a charge/discharge device according to a first embodiment.

A desirable mode of the invention will be illustrated below. In the present invention, the anomaly specification unit may have a configuration that specifies, based on the power source voltage that is input to the drive circuit and the output that is provided to the relay from the drive circuit during a period in which the drive instruction is being given to the drive circuit or during a period in which the drive instruction is not being given to the drive circuit, whether the portion in which the anomaly has occurred is the drive circuit or a portion other than the drive circuit.

In this way, by grasping the power source voltage that is input to the drive circuit and the output that is provided to the relay from the drive circuit during the period in which the drive instruction being given or the period in which the drive instruction is not being given, it becomes easier to accurately judge whether there is a high possibility that the anomaly has occurred in the drive circuit or whether this is not the case.

For example, in the case where a normal output is not provided from the drive circuit to the relay during the period in which the drive instruction is being given, even though the state of the power source voltage that is input to the drive circuit is normal, it can be said that there is a high possibility that an open-circuit fault has occurred in the drive circuit, and thus a high possibility that the portion in which an anomaly has occurred is the drive circuit. Alternatively, in the case where the state of the power source voltage that is input to the drive circuit is normal, and the drive output is performed from the drive circuit to the relay during the period in which the drive instruction is not being given, it can be said that there is a high possibility that a short-circuit fault has occurred in the drive circuit, and thus a high possibility that the portion in which an anomaly has occurred is the drive circuit. In this way, by judging whether the portion in which the anomaly has occurred is the drive circuit or a portion other than the drive circuit, based on the power source voltage that is input to the drive circuit, and the output that is provided to the relay from the drive circuit during the period in which the drive instruction is being given or during the period in which the drive instruction is not being given, the portion in which the anomaly has occurred can be more accurately narrowed down.

In the present invention, the anomaly specification unit the anomaly specification unit judges whether at least one of a current and a voltage that is provided to the relay during a period in which the drive instruction is being given exceeds a threshold value, and judges, based on a judgment result of whether the threshold value has been exceeded and a voltage of the charge/discharge path, whether the portion in which the anomaly has occurred is the relay.

In the case where at least one of the current and the voltage that are provided to the relay during the period in which the drive instruction is being given exceeds a threshold value, there is a high possibility that the drive current that is being given to the relay is normal. On the other hand, if the relay is normal, the operation and non-operation of the relay will tend to be reflected in the voltage of the charge/discharge path. Therefore, by evaluating the above judgment result and the voltage of the charge/discharge path, it can be judged more accurately whether the portion in which the anomaly has occurred is the relay.

In the present invention, the anomaly specification unit may have a configuration that judges, based on the power source voltage that is input to the drive circuit, whether the portion in which the anomaly has occurred is a circuit that inputs the power source voltage.

In the case where the power source voltage that is input to the drive circuit is not in a normal state, there is a high possibility that the anomaly has occurred in the circuit that inputs the power source voltage. Therefore, by evaluating the power source voltage that is input to the drive circuit, it can be discriminated whether the portion in which the anomaly has occurred is the drive circuit itself or a circuit portion upstream of the power source voltage being input.

In the present invention, on the charge/discharge path connected to the electrical storage unit, a capacitor having a smaller capacitance than the electrical storage unit may be connected in parallel to the electrical storage unit. Also, the anomaly specification unit may have a configuration that determines, in a case where the charge operation or the discharge operation is performed by the charge/discharge circuit during the period in which an instruction for setting the relay to the OFF state is being given to the drive circuit from the control unit, whether the voltage of the charge/discharge path has changed in excess of a predetermined potential difference during the charge operation or the discharge operation, and specifies the portion in which the anomaly has occurred, based on a judgment result of whether the voltage of the charge/discharge path has changed in excess of the predetermined potential difference, the power source voltage that is input to the drive circuit, and the output that is provided to the relay.

With the configuration in which a capacitor having a smaller capacitance than the electrical storage unit is connected in parallel to the electrical storage unit, in the case where an instruction for setting the relay to an OFF state is given to the drive circuit from the control unit, the degree of change in the voltage of the charge/discharge path following a charge operation or a discharge operation differs between the case where the relay switches to an OFF state normally and the case where the relay remains in an ON state (the case where the relay does not switch normally). In other words, since charging/discharging of only the capacitor having a small capacitance is performed, out of the electrical storage unit and the capacitors that are connected to the charge/discharge path, in the case where the relay switches to an OFF state normally, a large change in voltage occurs in a relatively short period of time on the charge/discharge path during the charge operation or the discharge operation. Conversely, since charging/discharging of both the electrical storage unit and the capacitor that are connected to the charge/discharge path is performed in the case where the relay remains in an ON state (in the case where the relay does not switch normally), a large change in voltage tends not to occur in a short period of time during the charge operation or the discharge operation.

Therefore, in the case where the charge operation or the discharge operation is performed by the charge/discharge circuit during the period in which an instruction for setting the relay to an OFF state is being given to the drive circuit from the control unit, by specifying the portion in which the anomaly has occurred, based on the result of determining whether the voltage of the charge/discharge path has changed in excess of a predetermined potential difference, the power source voltage that is input to the drive circuit, and the output that is given from the drive circuit to the relay, it becomes easier to more specifically narrow down the portion in which the anomaly has occurred.

For example, by evaluating the power source voltage, it can be judged whether an anomaly has occurred in a circuit portion upstream of the power source voltage being input.

Also, by evaluating the power source voltage that is input to the drive circuit and the output given from the drive circuit to the relay, it can be judged whether the anomaly has occurred in the drive circuit. Furthermore, in the case where the anomaly has not occurred in the power source voltage and the drive circuit, it can be said that there is a high possibility that isolation by the relay is not being performed normally, in the case where the voltage of the charge/discharge path has not changed in excess of the predetermined potential difference during the charge operation or the discharge operation, even though the drive circuit is operating normally. Therefore, it becomes possible to judge whether the path of the relay is operating normally.

In the present invention, the relay may be a latching relay that holds a set state in response to a first drive current flowing to a first conduction path, and holds a reset state in response to a second drive current flowing to a second conduction path. The drive circuit may have a configuration that sends the first drive current to the relay in a case where the first drive instruction is given as the drive instruction, and sends the second drive current to the relay in a case where the second drive instruction is given as the drive instruction. The control unit may have a configuration that controls the first drive instruction and the second drive instruction that are given to the drive circuit. The anomaly specification unit may have a configuration that specifies the portion in which the anomaly has occurred at a time of a drive for holding the set state, based on the power source voltage, the output that is provided to the relay from the drive circuit at least in the period in which the first drive instruction is given by the control unit and the voltage of the charge/discharge path, and specifies the portion in which the anomaly has occurred at a time of a drive for holding the reset state, based on the output that is provided to the relay from the drive circuit at least in the period in which the second drive instruction is given by the control unit and the voltage of the charge/discharge path.

According to the present configuration, the location of the anomaly in the case where the anomaly occurs at the time of driving the latching relay in order to hold the latching relay in a set state and the location of the anomaly in the case where the anomaly occurs at the time of driving the latching relay in order to hold the latching relay in a reset state can be specifically narrowed down. In other words, the portion in which the anomaly has occurred can be specified depending on when the latching relay is operated, and a more specific anomaly diagnosis can be realized.

First Embodiment

Hereinafter, a first embodiment for carrying out the present invention will be described. FIG. 1 is a block diagram illustrating an in-vehicle charge/discharge system 100 that uses a charge/discharge device 1 according to the first embodiment. The charge/discharge system 100 shown in FIG. 1 is configured, for example, as a system that converts electric power that is supplied from a primary power source 120 or the like, stores the converted power in the electrical storage cell 104, and drives a load which is not illustrated with electric power stored in the electrical storage cell 104.

In the charge/discharge system 100, the primary power source 120 is connected to a conduction path 15 on the input side, and an electrical storage cell 104 serving as secondary power source is connected to a conduction path 16 on the output side. The primary power source 120 is constituted, for example, as an electrical storage cell such as a lead battery. The electrical storage cell 104 corresponding to the secondary power source corresponds to an example of an electrical storage unit. The electrical storage cell 104 need only be a configuration that can store electric power that is supplied from the charge/discharge circuit 4, and, a lithium-ion cell, an electric double-layer capacitor, or another type of capacitor can be used, for example.

The conduction path 15 on the input side has a configuration that electrically connected to a terminal on the high potential side of the primary power source 120, and to which a predetermined direct-current voltage is applied from the primary power source 120. Note that electrical components which are not illustrated such as an alternator are connected to the conduction path 15 on the input side.

The conduction path 16 on the output side has a configuration that electrically connected to a terminal on the high potential side of the electrical storage cell 104, and to which a predetermined direct-current voltage is applied from the electrical storage cell 104. Note that loads which are not illustrated such as a starter are connected to the conduction path 16 on the output side.

A latching relay 110 corresponds to an example of a relay, and is connected in series to the electrical storage cell 104 between the electrical storage cell 104 and ground. The latching relay 110 has a configuration that switches between an ON state allowing and an OFF state disallowing charging/discharging of the electrical storage cell 104, and switches between an OFF state and an ON state according to the drive current that is provided from a relay drive circuit 8. Specifically, the latching relay 110 is, for example, constituted as a dual coil latching relay, and holds a set state in response to a first drive current flowing to a first coil 114 via a first conduction path 51. In this set state, the latching relay 110 is maintained in an ON state even after the first drive current stops flowing to the first coil 114, resulting in the conduction path 17 between the electrical storage cell 104 and ground being maintained in a conduction state, and the negative-side terminal of the electrical storage cell 104 being kept at ground potential. Also, the latching relay 110 holds a reset state in response to a second drive current flowing to a second coil 112 via a second conduction path 52. In this reset state, the latching relay 110 is maintained in an OFF state even after the second drive current stops flowing to the second coil 112, resulting in the conduction path 17 between the electrical storage cell 104 and ground being maintained in a non-conduction state, and the negative-side terminal of the electrical storage cell 104 entering an open state.

The charge/discharge device 1 is, for example, constituted as an in-vehicle DC-DC converter system, and has a configuration that steps up or steps down the direct-current voltage applied to the conduction path 15 on the input side and output the resultant voltage to the conduction path 16 on the output side.

The charge/discharge circuit 4 is connected to a circuit portion provided with the latching relay 110 (circuit portion in which the electrical storage cell 104 and the latching relay 110 are connected in series), and performs a charge operation for charging the electrical storage cell 104 in response to a charge instruction from a control unit 6 that is given via the control circuit 7, and a discharge operation for discharging the electrical storage cell 104 in response to a discharge instruction. This charge/discharge circuit 4 is constituted as a well-known step up/down DC-DC converter circuit, and performs a step-up operation or a step-down operation by repeatedly turning a switching element ON and OFF with a pulse signal (PWM signal) input from a control circuit 7. In a step down mode, the direct-current voltage applied to the conduction path 15 on the input side is stepped down, and a voltage corresponding to the duty ratio of a PWM signal that is output from the control circuit 7 is output to the conduction path 16 on the output side. In a step up mode, the direct-current voltage applied to the conduction path 15 on the input side is stepped up, and a voltage corresponding to the duty ratio of the PWM signal that is output from the control circuit 7 is output to the conduction path 16 on the output side. Note that the charge/discharge circuit 4 may, for example, be a known step up/down circuit employing a step up/down chopper method, or may be a Cuk converter, a SEPIC, a 4-switch converter or the like.

The control unit 6 has a configuration that controls the charge instruction and the discharge instruction that are given to the charge/discharge circuit 4 and the drive instruction that is given to the relay drive circuit 8. This control unit 6 is constituted as a microcomputer, for example, and serves as a signal output source for outputting a PWM signal that is alternately switched between high-level and low-level to the charge/discharge circuit 4. The PWM signal that is output from the control unit 6 is input to the control circuit 7 (FET drive unit), and a PWM signal is output by this control circuit 7 to one or a plurality of switching elements.

The control unit 6 is constituted to be provided with a computational device such as a CPU and a memory device such as a ROM or a RAM. Also, the control unit 6 has a configuration that can acquire the current value and the voltage value detected by an electrical storage cell-side current detection circuit 22 and an electrical storage cell-side voltage detection circuit 24, and has a configuration that can also acquire further the current value and the voltage value detected by a battery-side current detection circuit 32 and a battery-side voltage detection circuit 34. Also, the control unit 6 has a configuration that can acquire an ON signal and an OFF signal that specify the ON/OFF state of the ignition switch of the vehicle.

The control unit 6 constituted in this way controls starting and stopping of operation of the charge/discharge circuit 4, the duty ratio, and the like, based on the acquired current value and voltage value. For example, the control unit 6, in the case where the ignition switch changes to an ON state, starts operation of the charge/discharge circuit 4, and causes the charge/discharge circuit 4 to perform the step-up operation or the step-down operation. The control unit 6, in the case where the ignition switch changes to an OFF state, then stops operation of the charge/discharge circuit 4.

The electrical storage cell-side current detection circuit 22 (hereinafter, current detection circuit 22) is provided to be interposed on the conduction path 16 (charge/discharge path) on the output side that is connected from the charge/discharge circuit 4 to the electrical storage cell 104. This current detection circuit 22 is constituted as a well-known current detection circuit, and detects current that flows through the conduction path 16 on the output side and inputs the detected current value to the control unit 6. The electrical storage cell-side voltage detection circuit 24 (hereinafter, voltage detection circuit 24) is constituted as a well-known voltage detection circuit, and detects the voltage of the conduction path 16 on the output side (i.e., voltage of the positive-side terminal of the electrical storage cell 104 with reference to ground potential) and inputs the detected voltage value to the control unit 6.

The battery-side current detection circuit 32 (hereinafter, current detection circuit 32) is provided to be interposed on the conduction path 15 on the input side that is connected from the primary power source 120 to the charge/discharge circuit 4. This current detection circuit 32 is constituted as a well-known current detection circuit, and detects current that flows through the conduction path 15 on the input side and inputs the detected current value to the control unit 6. The battery-side voltage detection circuit 34 (hereinafter, voltage detection circuit 34) is constituted as a well-known voltage detection circuit, and detects the voltage of the conduction path 15 on the input side (i.e., voltage of the positive-side terminal of the primary power source 120 with reference to ground potential) and inputs the detected voltage value to the control unit 6.

On the conduction path 16 on the output side that serves as the output path from the charge/discharge circuit 4, a capacitor 130 is connected in parallel to the electrical storage cell 104, between the charge/discharge circuit 4 and the electrical storage cell 104. This capacitor 130 functions as a rectification capacitor that rectifies through smoothing the output current of the conduction path 16 on the output side, and has a smaller capacitance than the electrical storage cell 104, for example.

The relay drive circuit 8 is constituted as a circuit that corresponds to an example of a drive circuit, and switches ON/OFF of the latching relay 110. This relay drive circuit 8 has a configuration to which the power source voltage is input via the source conduction path 50, and has a configuration that, in the case where a predetermined drive instruction is given from the control unit 6, generates drive current based on this power source voltage and supplies the drive current to the latching relay 110. Specifically, the relay drive circuit 8 has a configuration that, in the case where a first drive instruction is given as a drive instruction from the control unit 6, sends the first drive current to the latching relay 110 via the first conduction path 51, and, in the case where the second drive instruction is given as a drive instruction, sends the second drive current to the latching relay 110.

Figure 2:
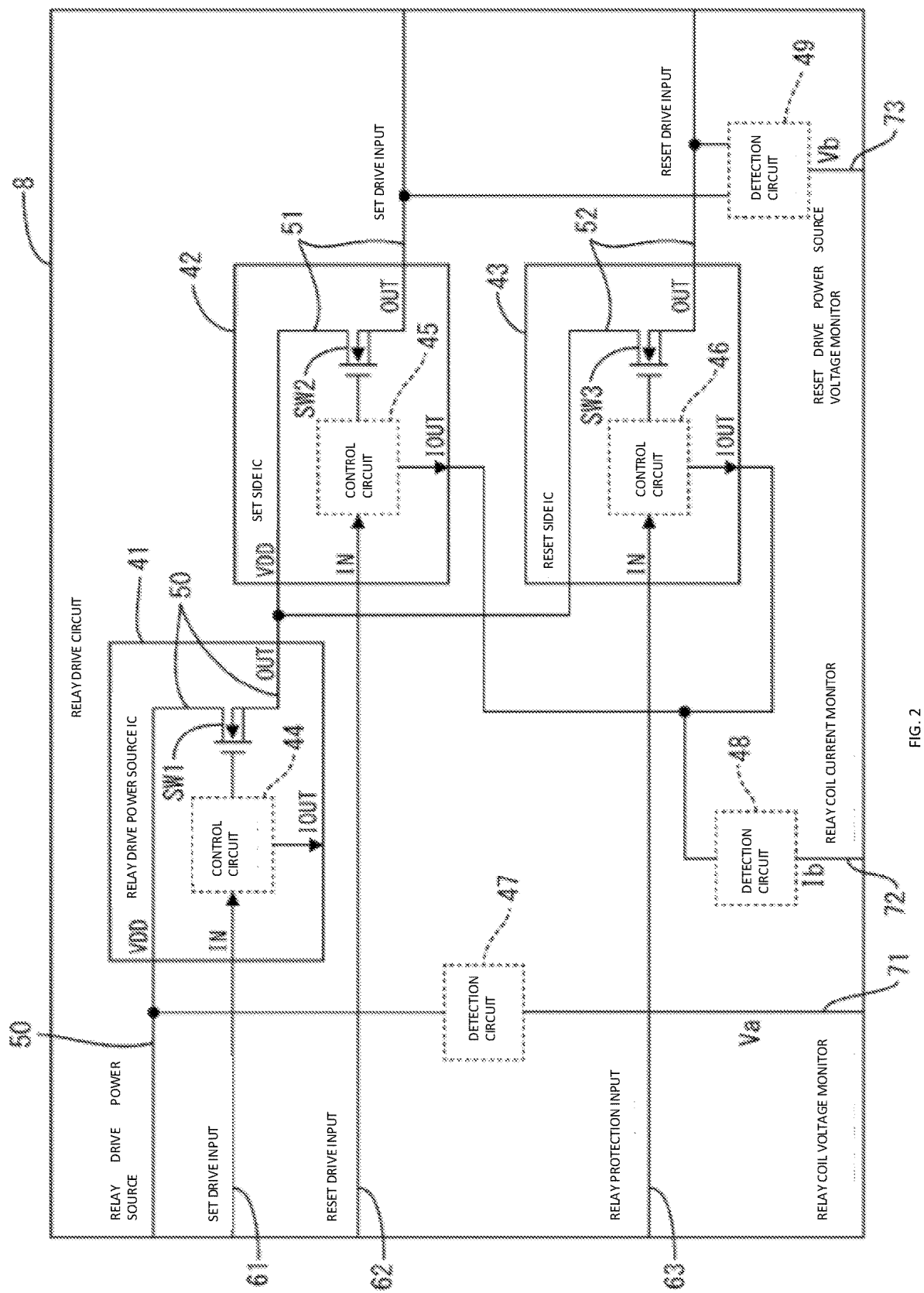
FIG. 2 is a block diagram illustrating the internal configuration of a relay drive circuit forming part of the charge/discharge device of FIG. 1.

As shown in FIG. 2, the relay drive circuit 8 is provided with a source conduction path 50 to which a predetermined constant voltage is applied from a power unit, which is not illustrated, provided outside of the relay drive circuit 8. Two conduction paths (first conduction path 51 and second conduction path 52) branch from this source conduction path 50. An IC 41 for relay protection is provided on the source conduction path 50, a set-side IC 42 is provided on the first conduction path 51, and a reset-side IC 43 is provided on the second conduction path 52.

In the IC 41 for relay protection, a switch element SW1 constituted by a MOSFET is interposed on the source conduction path 50. The switch element SW1 switches to an ON state in the case where an ON signal is input to a gate thereof via a signal line 61, and switches to an OFF state in the case where an OFF signal is input to the gate. The signal line 61 is constituted as a conduction path that is connected to the control unit 6 and through which the ON signal (H level signal) or the OFF signal (L level signal) from the control unit 6 is input to the gate of switch element SW1. When the switch element SW1 is in an ON state, a state in which current can flow to the source conduction path 50 via the switch element SW1 is entered, and when the switch element SW1 is in an OFF state, current does not flow through the switch element SW1, and conduction of current on the source conduction path 50 is interrupted. Also, a control circuit 44 that outputs a detection value indicating the current that flows between the drain and source of the switch element SW1 is provided in the IC 41 for relay protection.

In the set-side IC 42, a switch element SW2 constituted by a MOSFET is interposed on the first conduction path 51. The switch element SW2 switches to an ON state when an ON signal is input to a gate thereof via a signal line 62, and switches to an OFF state when an OFF signal is input to the gate. The signal line 62 is constituted as a conduction path that is connected to the control unit 6 and through which the ON signal (H level signal) or the OFF signal (L level signal) from the control unit 6 is input to the gate of the switch element SW2. When the switch element SW2 is in an ON state, a state in which current can flow to the first conduction path 51 via the switch element SW2 is entered, in the case where the switch element SW2 is in an OFF state, current does not flow through the switch element SW2, and conduction of current on the first conduction path 51 is interrupted. Also, a control circuit 45 that outputs a detection value indicating the current that flows between the drain and source of the switch element SW2 is provided in the set-side IC 42.

In the reset-side IC 43, a switch element SW3 constituted by a MOSFET is interposed on the second conduction path 52. The switch element SW3 switches to an ON state when an ON signal is input to a gate thereof via the signal line 63, and switches to an OFF state when an OFF signal is input to the gate. The signal line 63 is constituted as a conduction path that is connected to the control unit 6 and through which the ON signal (H level signal) or the OFF signal (L level signal) from the control unit 6 is input to the gate of switch element SW3. When the switch element SW3 is in an ON state, a state in which current can flow to the second conduction path 52 via the switch element SW3 is entered, and when the switch element SW3 is in an OFF state, current does not flow through the switch element SW3, and conduction of current on the second conduction path 52 is interrupted. Also, a control circuit 46 that outputs a detection value indicating the current that flows between the drain and source of switch element SW3 is provided in the reset-side IC 43.

Furthermore, detection circuits 47, 48 and 49 are provided in the relay drive circuit 8. The detection circuit 47 is constituted as a well-known voltage detection circuit, and outputs a voltage value Va of the source conduction path 50. An output line 71 that outputs a power source voltage value Va from the detection circuit 47 is connected to the control unit 6, and the voltage value Va is input to the control unit 6. The detection circuit 48 outputs, as Ib, the current value of the conduction path through which the coil current is flowing, out of the first conduction path 51 and the second conduction path 52. An output line 72 through which the current value Ib is output from the detection circuit 48 is connected to the control unit 6, and the current value Ib is input to the control unit 6. Specifically, in a state in which the switch element SW2 is operating and the switch element SW3 is not operating, the current that flows between the drain and source of the switch element SW2, that is, the value of current that flows to the first conduction path 51, is output as Ib, and, in a state in which the switch element SW3 is operating and the switch element SW2 is not operating, the value of current that flows to the second conduction path 52 is output as Ib. The detection circuit 49 outputs, as Vb, the voltage value of the conduction path through which the coil current is flowing, out of the first conduction path 51 and the second conduction path 52. An output line 73 through which the voltage value Vb is output from the detection circuit 49 is connected to the control unit 6, and the voltage value Vb is input to the control unit 6. Specifically, in a state in which the coil current is flowing through only the first conduction path 51, out of the first conduction path 51 and the second conduction path 52, the detection circuit 49 outputs the voltage value of the first conduction path 51 as Vb, and, in a state in which the coil current is flowing through only the second conduction path 52, the detection circuit 49 outputs the voltage value of the second conduction path 52 as Vb.

Next, diagnostic processing that is performed in the charge/discharge device of FIG. 1 will be described. In the charge/discharge device 1, diagnosis is performed at various timings of the timing chart shown in FIG. 3. Specifically, diagnostic processing at the time of reset driving is performed in the flow of the flowchart shown in FIG. 4, and diagnostic processing at the time of set driving is performed in the flow of the flowchart shown in FIG. 8.

Figure 4:
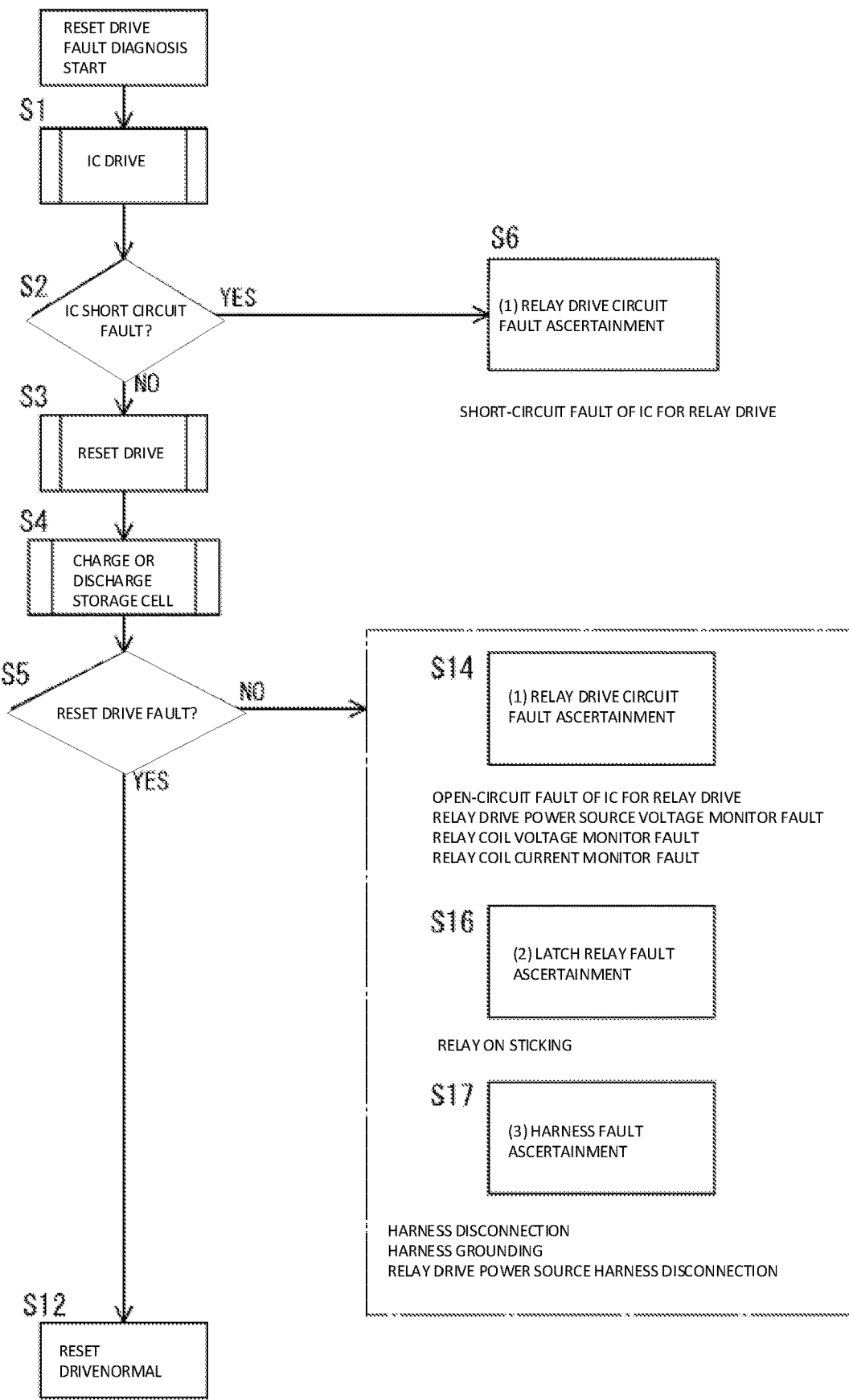
FIG. 4 is a flowchart illustrating the flow of diagnostic processing at the time of reset driving that is performed by the charge/discharge device of FIG. 1.

First, the diagnostic processing at the time of reset driving will be described, with reference to FIG. 4 and the like. The diagnostic processing at the time of reset driving shown in FIG. 4 is processing that is executed by the control unit 6 when a predetermined start condition is established. The start condition for performing the diagnostic processing at the time of reset driving may be, for example, the timing at which the ignition switch is turned OFF or turned ON, or an inspection timing other than these timings. Note that, before the start of the diagnostic processing shown in FIG. 4, the latching relay 110 is maintained in the set state.

Figures 6, 7:
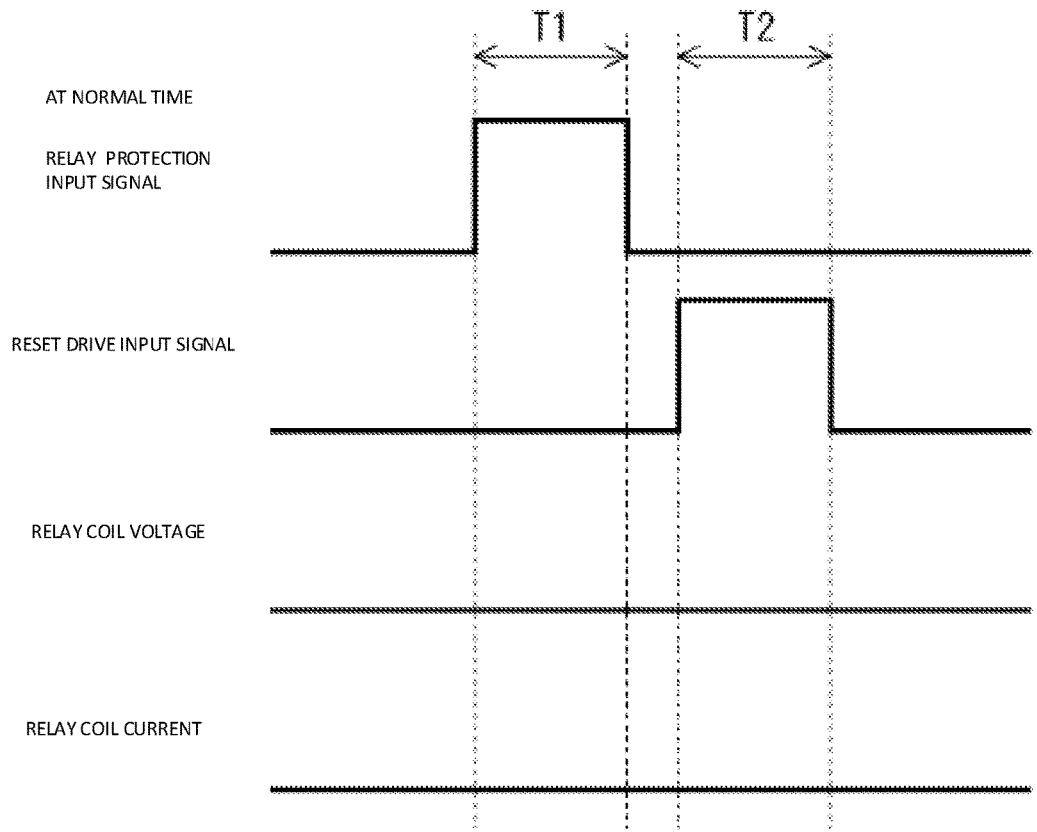
FIG. 6 is a timing chart showing the relationship of signals at the time of diagnosis of a short-circuit fault with a relay coil current and a relay coil voltage.
FIG. 7 is a table showing the correspondence relationship of signals in the case of diagnosing a short-circuit fault when the relay drive circuit is in a normal state with a relay coil current and a relay coil voltage.

The control unit 6, after starting the diagnostic processing of FIG. 4, causes an IC of the relay drive circuit 8 to perform a predetermined drive operation (S1). Specifically, as shown in FIG. 6, during a predetermined period T1, the relay drive circuit 8 is driven so as to switch the voltage (relay protection input signal) that is provided to the gate of the switch element SW1 to the H level, and to maintain the voltages that are provided to the gates of the switch elements SW2 and SW3 at the L level. Thereafter, during a predetermined period T2 after allowing a short period of time to elapse, the relay drive circuit 8 is driven so as to switch the voltage (reset drive input signal) that is provided to the gate of the switch element SW3 to the H level, and to maintain the voltage that is provided to the gate of the switch elements SW1 and SW2 at the L level.

In the case where operations are performed in this manner, current (relay coil current) should not flow to the first conduction path 51 or the second conduction path 52, during the period of periods T1 and T2, if the IC 41 for relay protection, the set-side IC 42 and the reset-side IC 43 are all in a normal state. In other words, if the IC 41 for relay protection, the set-side IC 42 and the reset-side IC 43 are all in a normal state, the output value (current value Ib) from the detection circuit 48 will be at a low level that is less than or equal to a predetermined current threshold value Ith1, and the output value (voltage value Vb) from the detection circuit 49 will be at a low level that is less than or equal to a predetermined voltage threshold value Vthb1, during both of periods T1 and T2, as shown in FIG. 6. Note that FIG. 7 shows a truth table of periods T1 and T2, and in period T1 during which the gate signal (relay protection input signal) that is provided to the switch element SW1 is the H level and the gate signal (reset drive input signal) that is provided to the switch element SW3 is the L level, the current value Ib (coil current) that is detected with the detection circuit 48 and the voltage value Vb (coil voltage) that is detected with the detection circuit 49 will both be the L level. Also, even in period T2 during which the gate signal (relay protection input signal) that is provided to the switch element SW1 is the L level and the gate signal (reset drive input signal) that is provided to the switch element SW3 is the H level, the current value Ib (coil current) that is detected with the detection circuit 48 and the voltage value Vb (coil voltage) that is detected with the detection circuit 49 will both be the L level.

In the diagnostic processing shown in FIG. 4, diagnosis that is based on such operations is performed in S2. Specifically, if, in either period T1 or period T2, the output value (current value Ib) from the detection circuit 48 exceeds the predetermined current threshold value Ith1 or the output value (voltage value Vb) from the detection circuit 49 exceeds the predetermined voltage threshold value Vthb1, the processing proceeds to YES in S2, and it is diagnosed that a short-circuit fault has occurred in which part of the relay drive circuit 8 has short-circuited at least at the time of reset driving, and the fault is ascertained (S6). Note that if the diagnosis is ascertained in S6, the processing of FIG. 4 is ended. Note that in the case where the anomaly occurs only in period T1, it may be diagnosed that the short-circuit fault has occurred in the switch element SW3. Alternatively, in the case where the anomaly occurs only in period T2, it may be diagnosed that the short-circuit fault has occurred in the switch element SW1.

Note that it may, for example, be judged whether the power source voltage value Va of the source conduction path 50 exceeds a predetermined voltage threshold value Vtha1 in at least one of period T1 and T2, and if the predetermined voltage threshold value Vtha1 has not been exceeded, it may be diagnosed that the portion in which the anomaly has occurred is the circuit that inputs the power source voltage to the source conduction path 50.

If, in either of periods T1 and T2, the output value (current value Ib corresponding to the detection value) from the detection circuit 48 does not exceed the predetermined current threshold value Ith1, and the output value (voltage value Vb corresponding to the detection value) from the detection circuit 49 does not exceed the predetermined voltage threshold value Vthb1, the processing proceeds to NO at S2.

In the case of the processing proceeding to NO at S2, the predetermined reset drive is performed (S3). The control unit 6, in the case of performing the reset drive of S3, first acquires, in an initial period T3, the voltage value (electrical storage cell voltage) of the conduction path 16 on the output side that is output from the voltage detection circuit 24. Note that the voltage value output from the voltage detection circuit 24 in period T3 is given as V_C_A. The control unit 6, in period T4 after period T3, continues to continuously output the ON signal (relay protection input signal) of the H level to the gate of the switch element SW1, and, furthermore, continuously outputs the ON signal (reset drive input signal) of the H level to the gate of the switch element SW3 in period T5 that overlaps with period T4. In the time slot (period T6) overlapping with the second half of the output period T5, the voltage value Va (relay drive power source voltage) of the source conduction path 50 that is output from the detection circuit 47, the current value Ib (relay coil current) that is output from the detection circuit 48, and the voltage value Vb (relay coil voltage) that is output from the detection circuit 49 are then checked.

In the diagnostic processing of FIG. 4, the charge/discharge operation is performed after the processing of S3 (S4). In the charge/discharge operation of S4, the voltage value V_C_A checked in period T3 in the processing of S3 is compared with a predetermined threshold value VC_a_th1, and, if the voltage value V_C_A is larger than the threshold value VC_a_th1, the charge/discharge circuit 4 is caused to perform the discharge operation for a given period, and the electrical storage cell 104 is discharged. Conversely, if the voltage value V_C_A checked in S3 is less than or equal to the threshold value VC_a_th1, the charge/discharge circuit 4 is caused to perform the charge operation for a given period, and the electrical storage cell 104 is charged. Even in the case where one of the charge operation and the discharge operation is performed, the voltage value (electrical storage cell voltage) of the conduction path 16 on the output side that is output from the voltage detection circuit 24 in period T7 immediately after the operation has ended is acquired. The voltage value output from the voltage detection circuit 24 in period T7 is given as V_C_B.

Figure 5:
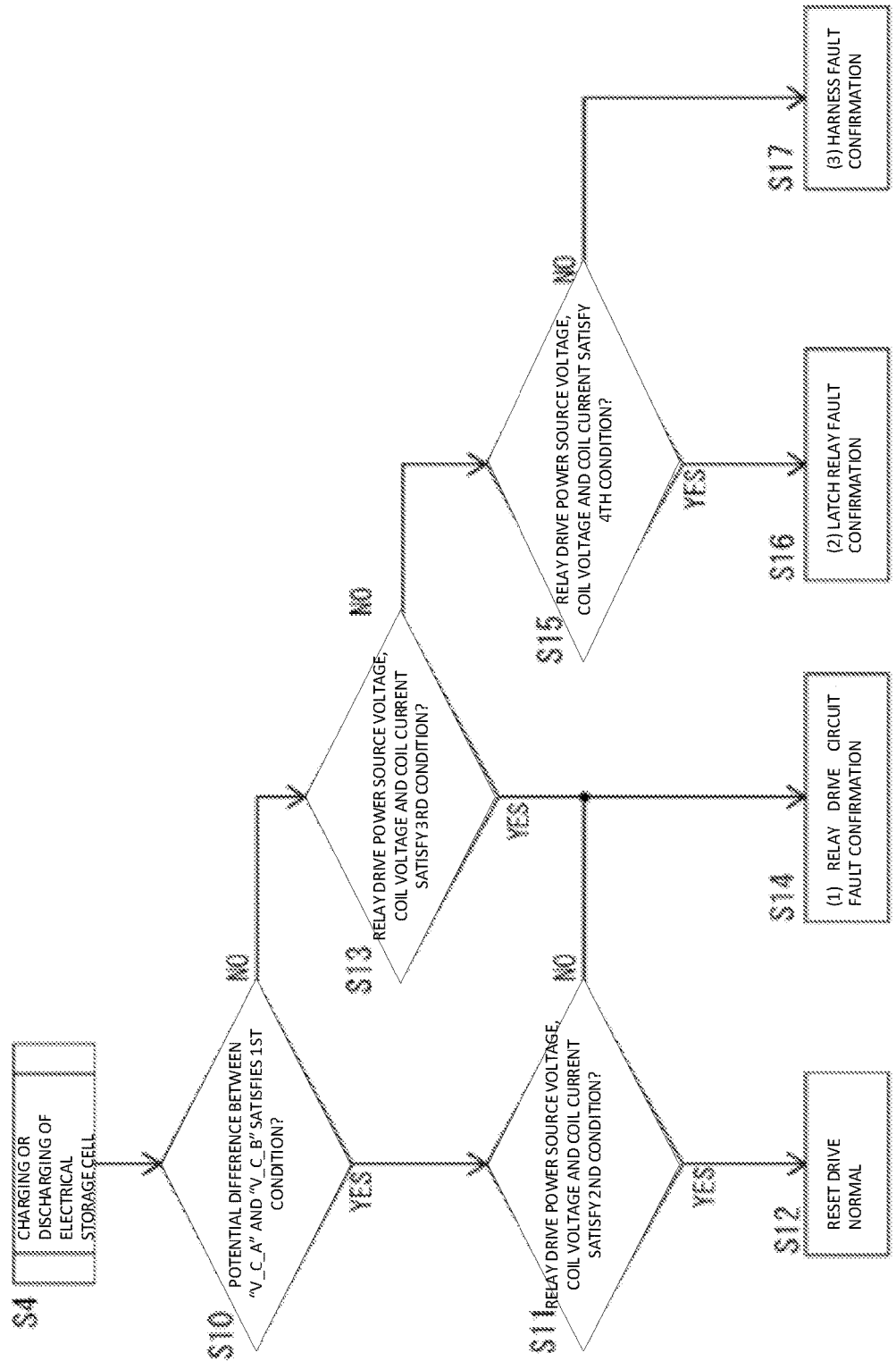
FIG. 5 is a flowchart illustrating the specific flow for part of the diagnostic processing of FIG. 4.

Although, in FIG. 4, the processing from S4 onward is shown in a simplified manner, the processing from S4 onward is, specifically, performed according to a flow such as shown in FIG. 5. As shown in FIG. 5, after the processing of S4 has ended, it is first judged whether the voltage difference between the voltage value V_C_A acquired in period T3 and the voltage value V_C_B acquired in period T7 satisfies a first condition (S10). Specifically, it is judged whether the absolute value of the difference between the voltage value V_C_A and the voltage value V_C_B exceeds a given value (predetermined potential difference), and the processing proceeds to YES in S10 if the given value is exceeded and proceeds to NO in S10 if the given value is not exceeded.

In the case where the processing proceeds to YES in S10 of FIG. 5, it is judged whether the power source voltage value Va, the current value Ib (relay coil current) and the voltage value Vb (relay coil voltage) detected during period T6 in the reset drive operation of S3 satisfy a second condition. Specifically, it is judged whether the power source voltage value Va of the source conduction path 50 is in a normal state exceeding the predetermined voltage threshold value Vtha1, the current value Ib of the coil current is in a normal state exceeding the predetermined current threshold value Ith1, and the voltage value Vb of the coil voltage is in a normal state exceeding the predetermined voltage threshold value Vthb1. If Va>Vtha1, ib>Ith1 and Vb>Vthb1, that is, if the power source voltage value Va, the coil current value Ib and the coil voltage value Vb are all in a normal state, the processing proceeds to YES in S11, and it is diagnosed that the relay is in a normal state at least at the time of reset driving (S12). After the processing of S12, the diagnostic processing of FIG. 4 is ended.

In S11 of FIG. 5, if any of the power source voltage value Va, the coil current value Ib and the coil voltage value Vb are anomalous, that is, if any of Va>Vtha1 (normal), ib>Ith1 (normal) and Vb>Vthb1 (normal) is not satisfied, the processing proceeds to NO at S11. Also, in the case where the processing proceeds to NO in S10, it is judged whether the power source voltage value Va, the coil current value Ib and the coil voltage value Vb detected during period T6 of the reset drive operation of S3 satisfy a third condition (S13). Specifically, it is judged whether Va>Vtha1 (normal), ib≤Ith1 (low current) and Vb≤Vthb1 (low voltage) are all satisfied, and if satisfied, the processing proceeds to YES in S13. In the case where the processing proceeds to NO in S11 or in the case where the processing proceeds to YES in S13, it is diagnosed that at least the relay drive circuit 8 is faulty at the time of reset driving (S14). After the processing of S14, the diagnostic processing of FIG. 4 is ended. Note that, in the case where the processing proceeds to NO in S11, the monitor value is anomalous, even though there is a high possibility that the latching relay 110 is switching normally, and thus it may, for example, be diagnosed that the anomaly has occurred in the detection circuits 48 or on the path of the detection circuits 48 and 49. On the other hand, in the case where the processing proceeds to YES in S13, there is a high possibility that the latching relay 110 is not switching normally due to the switch elements SW1 and SW3 not operating normally, and thus it may be diagnosed that the anomaly has occurred in one of the switch element SW1 and the switch element SW3.

If the third condition is not satisfied in S13 of FIG. 5, that is, if any of Va>Vtha1 (normal), Ib≤Ith1 (low current) and Vb≤Vthb1 (low voltage) are not satisfied, the processing proceeds to NO in S13, and it is judged whether the power source voltage value Va, the current value Ib (relay coil current), and the voltage value Vb (relay coil voltage) detected during period T6 in the reset drive operation of S3 satisfy a fourth condition (S15). Specifically, it is judged whether all of Va>Vtha1 (normal), ib>Ith1 (normal) and Vb>Vthb1 (normal) are satisfied, and, if satisfied, the processing proceeds to YES in S15, and it is diagnosed that the latching relay 110 is faulty at least at the time of reset driving (S16). After the processing of S16, the diagnostic processing of FIG. 4 is ended. In this case, it may be diagnosed that a sticking anomaly has occurred in the latching relay 110 in which the relay cannot be changed from an ON state (set state).

If the fourth condition is not satisfied in S15 of FIG. 5, that is, if any of Va>Vtha1 (normal), Ib>Ith1 (normal) and Vb>Vthb1 (normal) are not satisfied, the processing proceeds to NO in S15, and it is diagnosed that the harness is faulty at least at the time of reset driving (S17). After the processing of S17, the diagnostic processing of FIG. 4 is ended. Note that, in S17, it may be diagnosed that a portion excluding the relay drive circuit 8 and the latching relay 110 is faulty at least at the time of reset driving.

Figure 8:
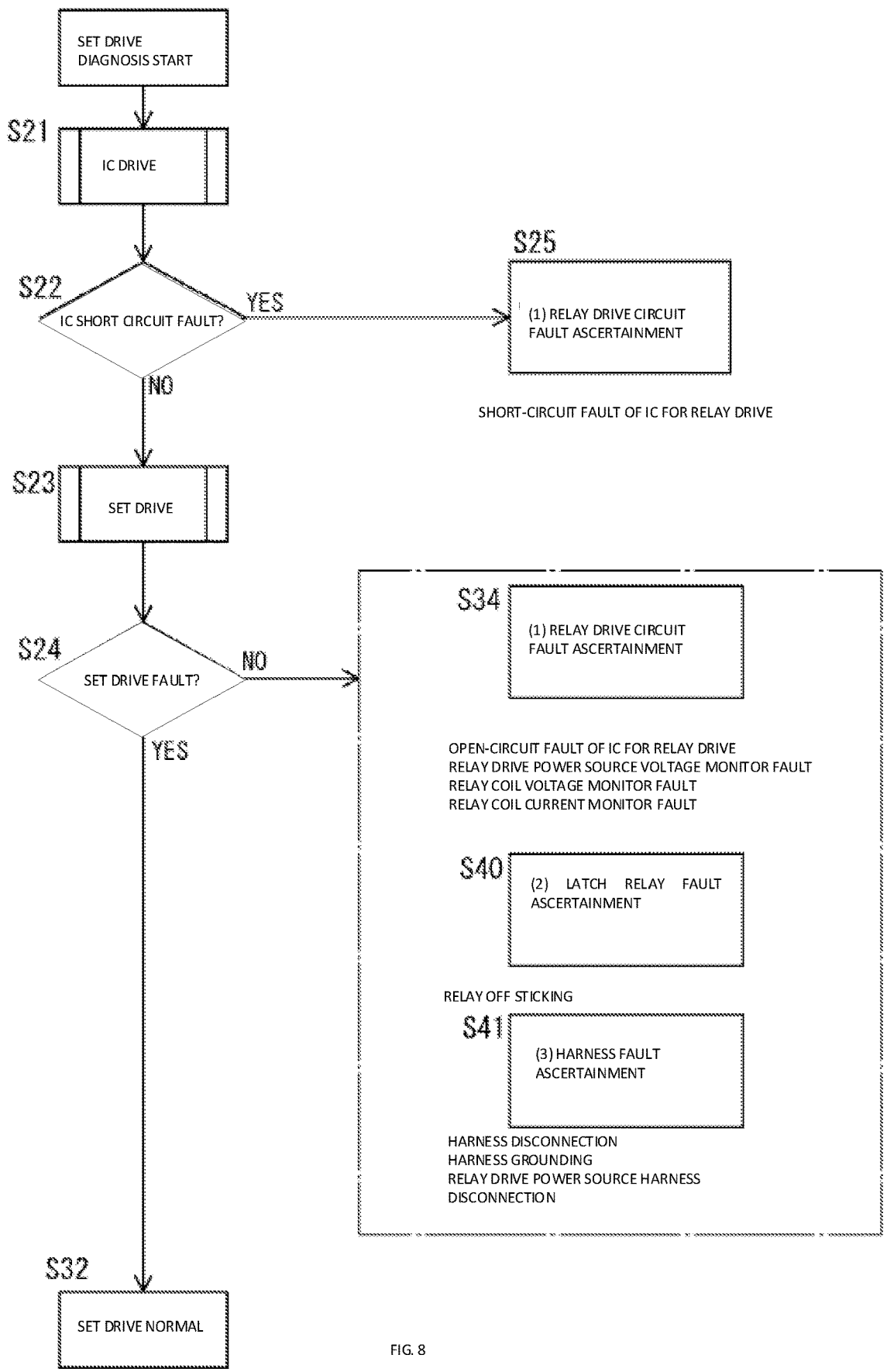
FIG. 8 is a flowchart illustrating the flow of diagnostic processing at the time of set driving that is performed by the charge/discharge device of FIG. 1.

Next, the diagnostic processing at the time of set driving will be described, with reference to FIG. 8 and the like. The diagnostic processing at the time of set driving shown in FIG. 8 is processing that is executed by the control unit 6 when a predetermined start condition is established. The start condition for performing the diagnostic processing at the time of set driving may be, for example, the timing at which the ignition switch is turned OFF or turned ON, or an inspection timing other than these timings. For example, the diagnostic processing at the time of set driving may be performed following the diagnostic processing at the time of reset driving of FIG. 4. Note that, before the start of the diagnostic processing shown in FIG. 8, the latching relay 110 is maintained in the reset state.

The control unit 6, after starting the diagnostic processing of FIG. 8, causes an IC of the relay drive circuit 8 to perform a predetermined drive operation (S21). This processing of S21 is similar processing to the processing of S1 in FIG. 4. Specifically, during a predetermined period T8 shown in FIG. 3, the relay drive circuit 8 is driven so as to switch the voltage (relay protection input signal) that is provided to the gate of the switch element SW1 to the H level, and to maintain the voltages that are provided to the gates of the switch elements SW2 and SW3 at the L level. Thereafter, during a predetermined period T9 after allowing a short period of time to elapse, the relay drive circuit 8 is driven so as to switch the voltage (set drive input signal) that is provided to the gate of the switch element SW2 to the H level, and to maintain the voltages that are provided to the gates of the switch elements SW1 and SW3 at the L level.

If, in the case where operations are performed in this manner, the IC 41 for relay protection, the set-side IC 42 and the reset-side IC 43 are all in a normal state, current (relay coil current) should not flow to either the first conduction path 51 or the second conduction path 52 shown in FIGS. 1 and 2, during periods T8 and T9. In the diagnostic processing shown in FIG. 8, diagnosis that is based on such operations is performed in S22. Specifically, if, in either of periods T8 and T9 (FIG. 3), the output value (current value Ib) from the detection circuit 48 exceeds the predetermined current threshold value Ith1 or the output value (voltage value Vb) from the detection circuit 49 exceeds the predetermined voltage threshold value Vthb1, the processing proceeds to YES in S22, and it is diagnosed that a short-circuit fault has occurred in which part of the relay drive circuit 8 has short-circuited at least at the time of the set drive, and the fault is ascertained (S25). Note that if the diagnosis is ascertained in S25, the processing of FIG. 8 is ended. Note that in the case where the anomaly occurs only in period T8, it may be diagnosed that the short-circuit fault has occurred in the switch element SW2. Alternatively, in the case where the anomaly occurs only in period T9, it may be diagnosed that the short-circuit fault has occurred in the switch element SW1.

If, in either of periods T8 and T9 (FIG. 3), the output value (current value Ib corresponding to the detection value) from the detection circuit 48 does not exceed the predetermined current threshold value Ith1, and the output value (voltage value Vb corresponding to the detection value) from the detection circuit 49 does not exceed the predetermined voltage threshold value Vthb1, the processing proceeds to NO in S22.

In the case of the processing proceeding to NO in S22, the predetermined set drive is performed (S23). The control unit 6, in the case of performing the set drive of S23, first acquires, in an initial period T10 (FIG. 3), the voltage value (electrical storage cell voltage) of the conduction path 16 on the output side that is output from the voltage detection circuit 24. Note that the voltage value output from the voltage detection circuit 24 in period T10 is given as V_C_C. The control unit 6, in period T11 (FIG. 3) after period T10, continues to continuously output the ON signal (relay protection input signal) of the H level to the gate of the switch element SW1, and, furthermore, continuously outputs the ON signal (set drive input signal) of the H level to the gate of the switch element SW2 in period T12 that overlaps with period T11. In the time slot (period T13) overlapping with the second half of the output period T12, the voltage value Va (relay drive power source voltage) of the source conduction path 50 that is output from the detection circuit 47, the current value Ib (relay coil current) that is output from the detection circuit 48, and the voltage value Vb (relay coil voltage) that is output from the detection circuit 49 are then checked.

Figure 9:
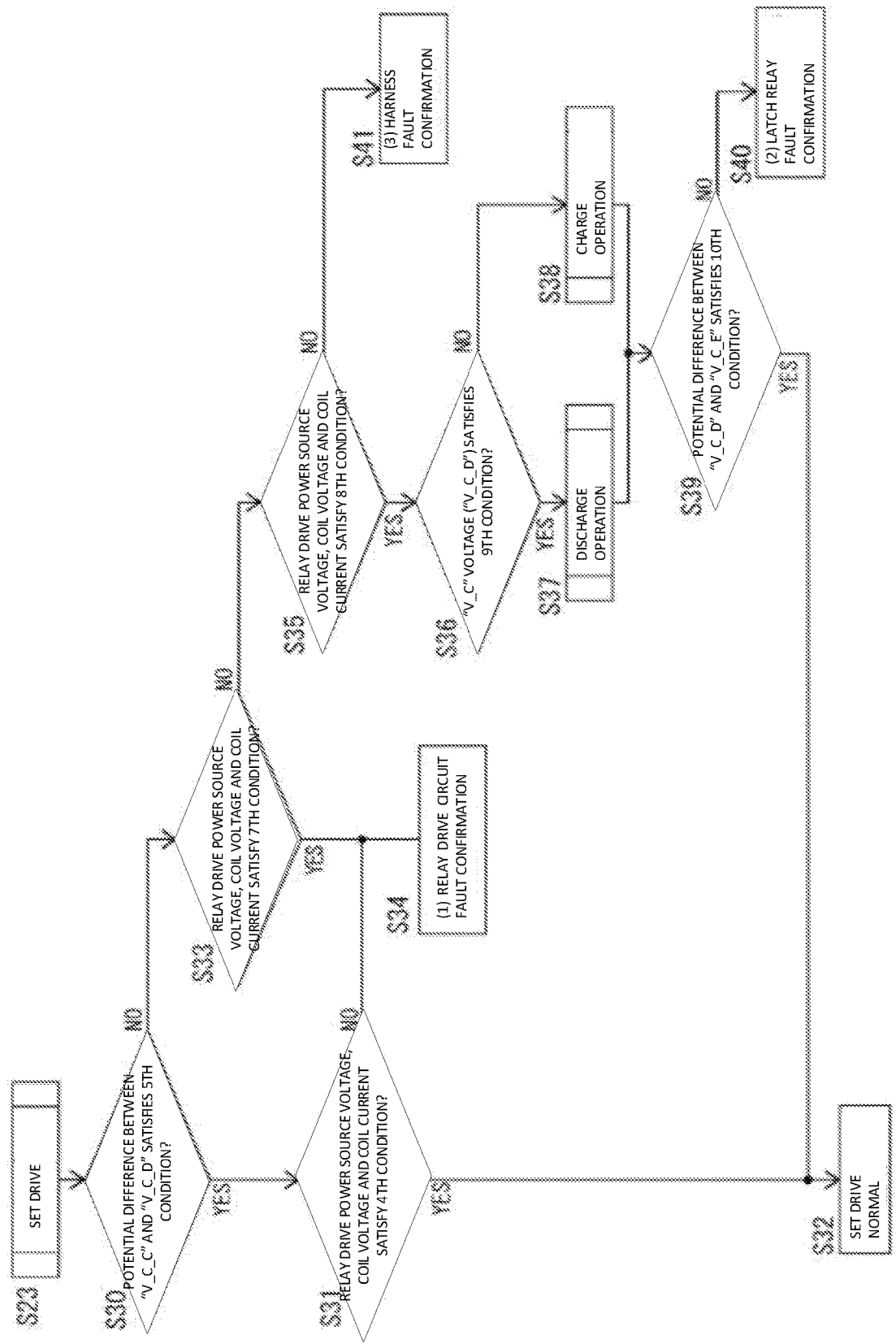
FIG. 9 is a flowchart illustrating the specific flow for part of the diagnostic processing of FIG. 8.

Although, in the diagnostic processing of FIG. 8, the processing from S23 onward is shown in a simplified manner, the processing from S23 onward is, specifically, performed according to a flow such as shown in FIG. 9. As shown in FIG. 9, in the processing of S30 that is performed after S23, the voltage value (electrical storage cell voltage) of the conduction path 16 on the output side that is output from the voltage detection circuit 24 is acquired in period T14 (FIG. 3) after turning OFF the switch element SW1. Hereinafter, the voltage value output from the voltage detection circuit 24 in period T14 will be described as V_C_D. In S30, after acquiring the voltage value V_C_D in period T14, this voltage value V_C_D is compared with the voltage value V_C_C acquired in period T10, and it is judged whether the voltage difference between the voltage value V_C_C and the voltage value V_C_D satisfies a fifth condition (S30). Specifically, it is judged whether the absolute value of the difference between the voltage value V_C_C and the voltage value V_C_D exceeds a given value (predetermined potential difference), and the processing proceeds to YES in S30 if the given value is exceeded and to NO in S30 if the given value is not exceeded.

In the case where the processing proceeds to YES in S30 of FIG. 9, it is judged whether the power source voltage value Va, the current value Ib (relay coil current) and the voltage value Vb (relay coil voltage) detected during period T13 (FIG. 3) satisfy a sixth condition (S31). Specifically, it is judged whether the power source voltage value Va of the source conduction path 50 is in a normal state exceeding the predetermined voltage threshold value Vtha1, the current value Ib of the coil current is in a normal state exceeding the predetermined current threshold value Ith1, and the voltage value Vb of the coil voltage is in a normal state exceeding the predetermined voltage threshold value Vthb1. If Va>Vtha1, ib>Ith1 and Vb>Vthb1, that is, if the power source voltage value Va, the coil current value Ib and the coil voltage value Vb are all in a normal state, the processing proceeds to YES in S31, and it is diagnosed that the relay is in a normal state at least at the time of set driving (S32). After the processing of S32, the diagnostic processing of FIG. 8 is ended. In other words, in the case where the processing proceeds to YES in S31 and the diagnosis of S32 is performed, there is a high possibility the voltage of the electrical storage cell 104 was applied normally to the conduction path 16 on the output side as a result of the switching operation (set operation) of the latching relay 110, and that a potential difference has thereby occurred, and since the power source voltage value Va, the coil current value Ib and the coil voltage value Vb are all normal, the relay is diagnosed as normal.

In S31 of FIG. 9, if any of the power source voltage value Va, the coil current value Ib and the coil voltage value Vb are anomalous, that is, if any of Va>Vtha1 (normal), ib>Ith1 (normal) and Vb>Vthb1 (normal) are not satisfied, the processing proceeds to NO at S31. Also, in the case where the processing proceeds to NO in S30, it is judged whether the power source voltage value Va, the coil current value Ib and the coil voltage value Vb detected during period T13 (FIG. 3) satisfy a seventh condition (S33). Specifically, it is judged whether Va>Vtha1 (normal), ib≤Ith1 (low current), and Vb≤Vthb1 (low voltage) are all satisfied, and, if satisfied, the processing proceeds to YES in S33. In the case where the processing proceeds to NO in S31 or to YES in S33, it is diagnosed that the relay drive circuit 8 is faulty at least at the time of set driving (S34). After the processing of S34, the diagnostic processing of FIG. 8 is ended.

Note that, in the case where the processing proceeds to NO in S31 of FIG. 9, the monitor value of the coil current or the coil voltage is anomalous, even though there is a high possibility that the latching relay 110 is switching normally, and thus it may, for example, be diagnosed that the anomaly has occurred in the detection circuits 48 or on the path of the detection circuits 48 and 49. On the other hand, in the case where the processing proceeds to YES in S33, there is a high possibility that the latching relay 110 is not switching normally due to the switch elements SW1 and SW2 not operating normally, and thus it may be diagnosed that the anomaly has occurred in one of the switch element SW1 and the switch element SW2.

If the seventh condition is not satisfied in S33 of FIG. 9, that is, if any of Va>Vtha1 (normal), Ib≤Ith1 (low current) and, Vb≤Vthb1 (low voltage) are not satisfied, the processing proceeds to NO in S33, and it is judged whether the power source voltage value Va, the current value Ib (relay coil current) and the voltage value Vb (relay coil voltage) detected during period T13 (FIG. 3) satisfy an eighth condition (S35). Specifically, it is judged whether all of Va>Vtha1 (normal), ib>Ith1 (normal) and Vb>Vthb1 (normal) are all satisfied. In the case where any thereof are not satisfied, the processing proceeds to NO in S35, and it is diagnosed that the harness is faulty at least at the time of set driving (S41). After the processing of S41, the diagnostic processing of FIG. 8 is ended. Note that, in S41, it may be diagnosed that a portion excluding the relay drive circuit 8 and the latching relay 110 is faulty.

In S35 of FIG. 9, if it is judged that all of Va>Vtha1 (normal), ib>Ith1 (normal) and Vb>Vthb1 (normal) are satisfied, the processing proceeds to YES in S35, the voltage value V_C_D checked in period T14 is compared with a predetermined threshold value VC_a_th2, and it is judged whether a ninth condition is satisfied. Specifically, if the voltage value V_C_D is larger than the threshold value VC_a_th2, the processing proceeds to YES in S36, the charge/discharge circuit 4 is caused to perform the discharge operation for a given period, and the electrical storage cell 104 is discharged. Conversely, if the voltage value V_C_D is less than or equal to the threshold value VC_a_th2, the processing proceeds to NO in S36, the charge/discharge circuit 4 is caused to perform the charge operation for a given period, and the electrical storage cell 104 is charged. Even if one of the charge operation and the discharge operation is performed, the voltage value (electrical storage cell voltage) of the conduction path 16 on the output side that is output from the voltage detection circuit 24 in period T15 immediately after the operation has ended is acquired. The voltage value output from the voltage detection circuit 24 in period T15 is given as V_C_E.

After S37 or S38, it is then judged whether the voltage difference between the voltage value V_C_D acquired in period T14 and the voltage value V_C_E acquired in period T15 satisfies a tenth condition (S39). Specifically, it is judged whether the absolute value of the difference between the voltage value V_C_D and the voltage value V_C_E exceeds a given value (predetermined potential difference), and the processing proceeds to YES in S39 if exceeded and to NO in S39 if not exceeded. In the case where the processing proceeds to YES in S39, it is diagnosed that the relay is in a normal state at least at the time of set driving (S32), and the diagnostic processing of FIG. 8 is ended. In other words, the case where the processing proceeds to YES in S39 and diagnosis is performed in S32 is a case in which a potential difference was not secured in period T10 and period T13, but a sufficient potential difference was confirmed by the discharge operation or the charge operation of S37 or S38, and the set state in which charging/discharging of the electrical storage cell 104 is possible is confirmed. Even in such a case, it is diagnosed at S32 that the relay is in a normal state.

In the case of the processing proceeding to NO in S39, it is diagnosed that the latching relay 110 is faulty at least at the time of set driving (S40). After the processing of S40, the diagnostic processing of FIG. 8 is ended. Note that, in this case, it may be diagnosed that a sticking anomaly has occurred in the latching relay 110 in which the relay cannot be changed from an OFF state (reset state).

As mentioned above, with the charge/discharge device 1 having the present configuration, the control unit 6 corresponds to an example of an anomaly specification unit, and the control unit 6 specifies the portion in which the anomaly has occurred based on the power source voltage that is input to the relay drive circuit 8, the output that is provided from the relay drive circuit 8 to the latching relay 110, and the voltage of the conduction path 16 (charge/discharge path) on the output side that is interposed between the charge/discharge circuit 4 and the electrical storage cell 104. Specifically, the control unit 6 has a configuration that can specify whether the portion in which the anomaly has occurred is the relay drive circuit 8 or a portion other than the relay drive circuit 8, based on the power source voltage that is input to the relay drive circuit 8 and the output that is provided to the latching relay 110 from the relay drive circuit 8 during the period in which the drive instruction is being given to the relay drive circuit 8 or the period in which the drive instruction is not being given. Furthermore, the control unit 6 has a configuration that judges whether at least one of the current and the voltage that are provided to the latching relay 110 during the period in which the drive instruction is being given exceeds the threshold value, and judges whether the portion in which the anomaly has occurred is the latching relay 110, based on the judgment result of whether the threshold has been exceeded and the voltage of the conduction path 16 (charge/discharge path) on the output side. Also, the control unit 6 has a configuration that can judge whether the portion in which the anomaly has occurred is the circuit that input the power source voltage, based on the power source voltage that is input to the relay drive circuit 8.

More specifically, the control unit 6 corresponding to an anomaly specification unit has a configuration that determines whether the voltage of the conduction path 16 (charge/discharge path) on the output side has changed by greater than or equal to a predetermined potential difference during the charge operation or the discharge operation such as in S10, in the case where the charge operation or the discharge operation is performed by the charge/discharge circuit 4 such as in S4 during the period (i.e., the period after period T5) in which the reset drive instruction (instruction for setting the latching relay 110 to an OFF state that is given to the relay drive circuit 8) is given by the control unit 6, and, furthermore, specifies the portion in which the anomaly has occurred, based on the judgment result of whether the voltage of the conduction path 16 on the output side has changed by greater than or equal to a predetermined potential difference, the power source voltage that is input to the relay drive circuit 8, and the output that is provided from the relay drive circuit 8 to the latching relay 110, such as in the processing from S10 onward.

Also, with the present configuration, the control unit 6 has a configuration that controls a "first drive instruction" and a "second drive instruction" that are given to the relay drive circuit 8. The "first drive instruction" is an instruction for sending the coil current to the first conduction path 51, and thereafter, not allowing the condition for sending the coil current to the second conduction path 52 to be established. Specifically, the instruction for giving an instruction to input a H level signal to the gates of both the switch elements SW1 and SW2, and, thereafter, maintaining the state of the switch elements SW1, SW2 and SW3 with the condition of not sending the coil current to the second conduction path 52 is the "first drive instruction". The "second drive instruction" is an instruction for sending the coil current to the second conduction path 52, and, thereafter, not allowing the condition for sending the coil current to the first conduction path 51 to be established. Specifically, the instruction for giving an instruction to input a H level signal to the gates of both the switch elements SW1 and SW3, and, thereafter, maintaining the state of the switch elements SW1, SW2, and SW3 with the condition of not sending the coil current to the first conduction path 51 is the "second drive instruction".

The control unit 6 specifies the portion in which the anomaly has occurred at the time of the drive for holding the set state, based on the power source voltage of the source conduction path 50, the output that is given from the relay drive circuit 8 to the latching relay 110 during the period in which the "first drive instruction" is being given, and the voltage of the conduction path 16 on the output side (charge/discharge path). Furthermore, the control unit 6 specifies the portion in which the anomaly has occurred at the time of the drive for holding the reset state, based on the output that is provided from the relay drive circuit 8 to the latching relay 110 during the period in which the "second drive instruction" is being given and the voltage of the conduction path 16 on the output side.

Next, the effects of the present configuration will be illustrated.

In the present configuration, a combination of the power source voltage that is input to the relay drive circuit 8 (drive circuit), the output that is provided from the relay drive circuit 8 to the latching relay 110 (relay) and the voltage of the conduction path 16 (charge/discharge path) on the output side that is interposed between the charge/discharge circuit 4 and the electrical storage cell 104 are in a relationship that changes depending on the portion in which the anomaly has occurred. Therefore, by adopting a configuration that specifies the portion in which the anomaly has occurred after having grasped these states, using the control unit 6 corresponding to an anomaly specification unit, the portion in which the anomaly has occurred can be more specifically narrowed down and specified.

Also, by grasping the power source voltage that is input to the relay drive circuit 8 (drive circuit) and the output that is provided to the latching relay 110 (relay) from the relay drive circuit 8 during the period in which the drive instruction is being given or is not being given, as in the present configuration, it becomes easy to accurately judge whether or not there is a high possibility that the anomaly has occurred in the relay drive circuit 8.

For example, in the case where normal output is not performed from the drive circuit to the latching relay 110 during the period in which the drive instruction is being given, even though the state of the power source voltage that is input to the relay drive circuit 8 is normal, it can be said that there is a high possibility that an open-circuit fault has occurred in the relay drive circuit 8, and thus a high possibility that the portion in which the anomaly has occurred is the relay drive circuit 8. Alternatively, in the case where the state of the power source voltage that is input to the relay drive circuit 8 is normal and the drive output is performed from the relay drive circuit 8 to the latching relay 110 during the period in which the drive instruction is not being given, it can be said that there is a high possibility that the short-circuit fault has occurred in the relay drive circuit 8, and there is a high possibility that the portion in which the anomaly has occurred is the relay drive circuit 8. By thus judging whether the portion in which the anomaly has occurred is the relay drive circuit 8, or a portion other than the relay drive circuit 8, based on the power source voltage that is input to the relay drive circuit 8, and the output that is provided to the relay from the relay drive circuit 8 during the period in which the drive instruction is being given or is not being given, the portion in which the anomaly has occurred can be more accurately narrowed down.

Also, with the present configuration, in the case where at least one of the current and the voltage that are provided to the latching relay 110 during the period in which the drive instruction is being given to the relay drive circuit 8 from the control unit 6 exceeds a threshold value, there is a high possibility that the drive current is being provided normally to the latching relay 110. On the other hand, if the latching relay 110 is normal, the operation and non-operation of the latching relay 110 tends to be reflected in the voltage of the conduction path 16 (charge/discharge path) on the output side. Therefore, by evaluating the judgment result of whether at least one of the current and the voltage that are provided to the latching relay 110 exceeds a threshold value and the voltage of the conduction path 16 on the output side, it can be more accurately judged whether the portion in which the anomaly has occurred is the latching relay 110.

Also, with the present configuration, in the case where the power source voltage that is input to the relay drive circuit 8 is not in a normal state, there is a high possibility that the anomaly has occurred in the circuit that inputs the power source voltage. Therefore, by evaluating the power source voltage that is input to the relay drive circuit 8, it can be discriminated whether the portion in which the anomaly has occurred is the relay drive circuit 8 itself or a circuit portion upstream of the power source voltage being input.

Also, with a configuration in which the capacitor 130 having a smaller capacitance than the electrical storage cell 104 is connected in parallel to the electrical storage cell 104, such as in the present configuration, the degree of change in the voltage on the charge/discharge path following the charge operation or the discharge operation differs between the case where an instruction for setting the latching relay 110 to an OFF state is given to the relay drive circuit 8 from the control unit 6, the case where the latching relay 110 switches normally to an OFF state, and the case where the latching relay 110 remains in an ON state (in the case where the latching relay 110 has not switched normally). In other words, since charging/discharging of only the capacitor 130 having a small capacitance is performed, out of the electrical storage cell 104 and the capacitor 130 that are connected to the conduction path 16 (charge/discharge path) on the output side, in the case where the latching relay 110 has switched normally to an OFF state, with the conduction path 16 on the output side, a large change in voltage occurs in a relatively short period of time, during the charge operation or the discharge operation. Conversely, since charging/discharging is performed on both the electrical storage cell 104 and the capacitor 130 that are connected to the conduction path 16 on the output side in the case where the latching relay 110 remains in an ON state (in the case where the latching relay 110 has not switched normally), a large change in voltage does not tend to occur in a short period of time during the charge operation or the discharge operation.

Therefore, in the case where the charge operation or the discharge operation is performed by the charge/discharge circuit 4 during the period in which an instruction for setting the latching relay 110 to an OFF state is being given to the relay drive circuit 8 from the control unit 6, by specifying the portion in which the anomaly has occurred, based on the judgment result of whether the voltage of the conduction path 16 (charge/discharge path) on the output side has changed by greater than or equal to a predetermined potential difference, the power source voltage that is input to the relay drive circuit 8, and the output that is provided from the relay drive circuit 8 to the latching relay 110, it becomes easier to more specifically narrow down the portion in which the anomaly has occurred.

For example, by evaluating the power source voltage that is input to the relay drive circuit 8, it can be judged whether the anomaly has occurred in a circuit portion upstream of the power source voltage being input. Also, by evaluating the power source voltage that is input to the relay drive circuit 8 and the output that is provided from the relay drive circuit 8 to the latching relay 110, it can be judged whether the anomaly has occurred in the relay drive circuit 8. Furthermore, in the case where the anomaly has not occurred in the power source voltage or the relay drive circuit 8, it can be said that there is a high possibility that isolation by the latching relay 110 is not being provided normally, even though the relay drive circuit 8 is operating normally, in the case where the voltage of the conduction path 16 (charge/discharge path) on the output side does not change by greater than or equal to a predetermined potential difference during the charge operation or the discharge operation. Therefore, it becomes possible to judge whether the path of the latching relay 110 is operating normally.

Also, according to the present configuration, the location of the anomaly in the case where the anomaly occurs at the time of the drive for holding the latching relay 110 in the set state and the location of the anomaly in the case where the anomaly occurs at the time of the drive for holding the latching relay 110 in the reset state can be specifically narrowed down. In other words, the portion in which the anomaly has occurred can be specified depending on when the latching relay is operated, and a more specific anomaly diagnosis can be realized.

Second Embodiment

Next, a second embodiment will be described. A charge/discharge device 1 of the second embodiment includes all the features of the charge/discharge device 1 of the first embodiment, and further includes additional features. In the following description and drawings, portions having a similar configuration to the charge/discharge device 1 of the first embodiment will be given the same reference signs as the charge/discharge device 1 of the first embodiment, and detailed description thereof will be omitted.

Figure 10:
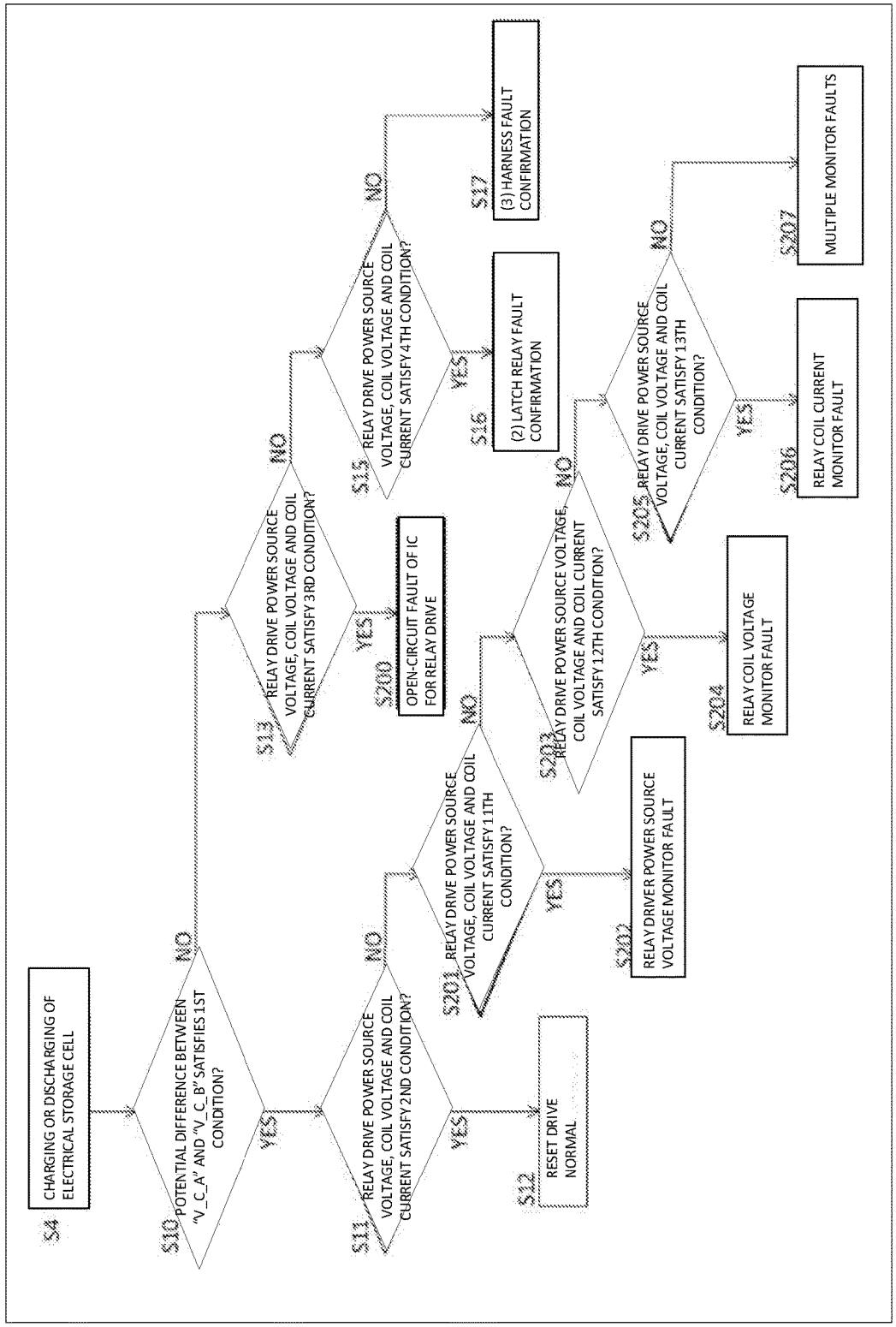
FIG. 10 is a flowchart illustrating the specific flow for part of the diagnostic processing at the time of reset driving that is performed by the charge/discharge device of a second embodiment.
Figure 11:
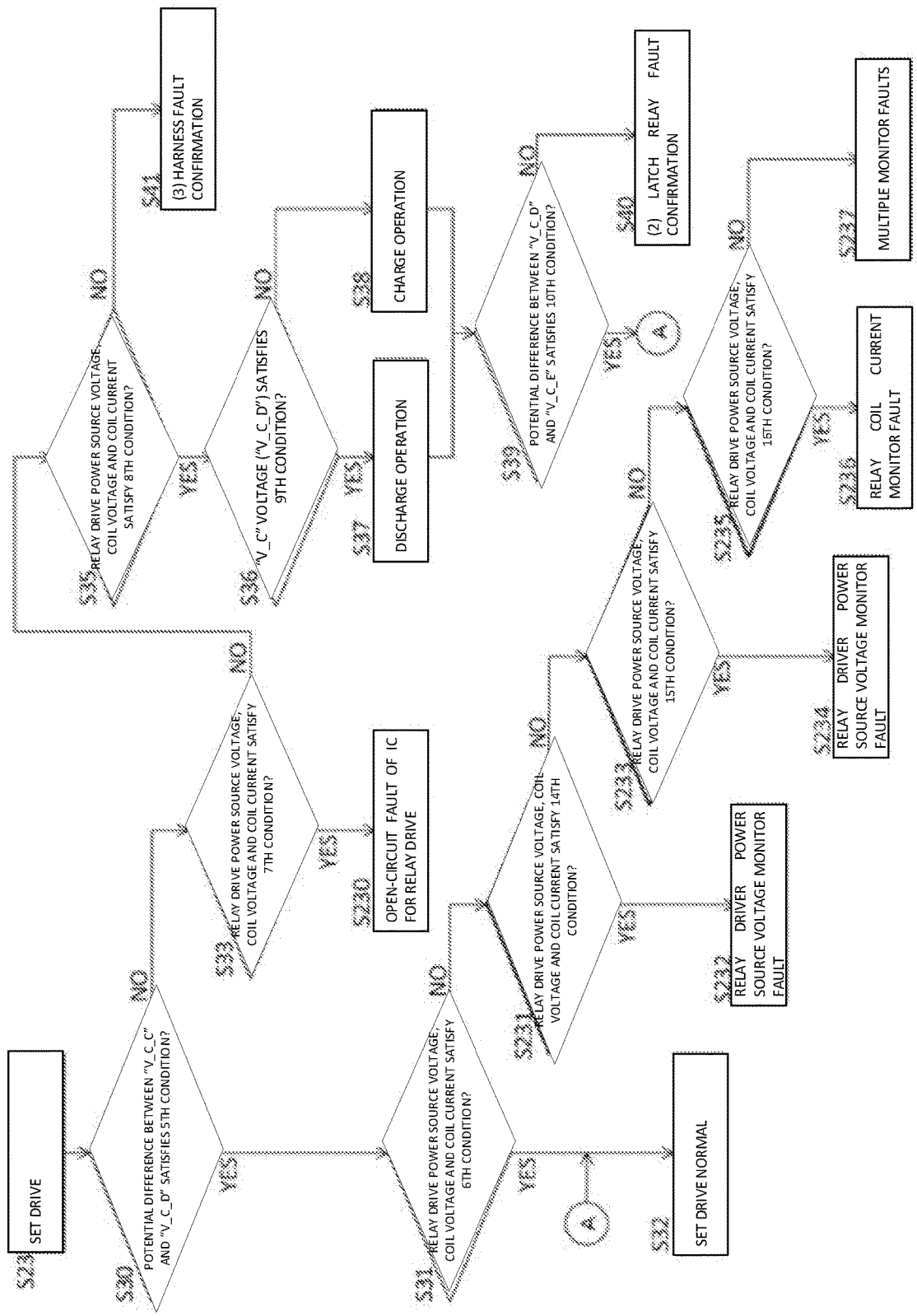
FIG. 11 is a flowchart illustrating the specific flow for part of the diagnostic processing at the time of set driving performed by the charge/discharge device of the second embodiment.

The charge/discharge device 1 of the second embodiment only differs from the first embodiment in that the controls shown in FIG. 5 are changed as shown in FIG. 10 and the controls shown in FIG. 9 are changed as shown in FIG. 11, and, except for these points, is the same as the charge/discharge device 1 of the first embodiment. Also, with regard to the contents shown in FIGS. 1 to 4 and FIGS. 6 to 8, the charge/discharge device 1 of the second embodiment is the same as the first embodiment. Hereinafter, description will be given with reference to these drawings as appropriate.

The charge/discharge device 1 of the second embodiment has a circuit configuration such as shown in FIG. 1. This charge/discharge device 1 is provided with an electrical storage cell-side voltage detection circuit 24 (FIG. 1) that is similar to the first embodiment. The electrical storage cell-side voltage detection circuit 24 corresponds to an example of a second voltage detection unit, and functions to detect the voltage of a conduction path 16 (charge/discharge path) that is interposed between a charge/discharge circuit 4 and an electrical storage cell 104 (electrical storage unit).

The charge/discharge device 1 of the second embodiment is provided with a capacitor 130 (FIG. 1) that is similar to the first embodiment. With this capacitor 130, the electrode on one side is electrically connected to the conduction path 16 (charge/discharge path), the electrode on the other side is electrically connected to ground, and charging or discharging is performed via the conduction path 16. The capacitor 130 is connected in parallel to the electrical storage cell 104, functions as a rectification capacitor that rectifies through smoothing the current of the conduction path 16 connected to the charge/discharge circuit, and has smaller capacitance than the electrical storage cell 104, for example.

With the charge/discharge device 1 of the second embodiment, a relay drive circuit 8 (FIG. 1) has a similar configuration to the first embodiment, and functions as an example of a drive circuit. The relay drive circuit 8 has a configuration that sends a first drive current to a latching relay 110 via the first conduction path 51 in the case where a first drive instruction (instruction for turning ON switch elements SW1 and SW2) is given from the control unit 6, and sends a second drive current to the latching relay 110 via the second conduction path 52 in the case where a second drive instruction (instruction for turning ON switch elements SW1 and SW3) is given.

In a charge/discharge system 100 to which the charge/discharge device 1 of the second embodiment is applied, the latching relay 110 has a similar configuration to the charge/discharge system 100 to which the charge/discharge device 1 of the first embodiment is applied, and is a latching relay that holds a set state in response to the first drive current flowing to the first conduction path 51, and holds a reset state in response to the second drive current flowing to the second conduction path 52. Specifically, the latching relay 110, in the case of being switched to the set state as a result of the first drive current flowing to the first conduction path 51, is maintained in the set state until the second drive current next flows to the second conduction path 52. Also, the latching relay 110, in the case of being switched to the reset state as a result of the second drive current flowing to the second conduction path 52, is maintained in the reset state until the first drive current next flows to the first conduction path 51. The latching relay 110 enables charging and discharging from the electrical storage cell 104 to the electrical storage cell 104 in the set state, and prohibits charging and discharging from the electrical storage cell 104 to the electrical storage cell 104 in the reset state.

Here, diagnostic processing that is performed in the charge/discharge device 1 of the second embodiment will be described mainly with reference to FIGS. 3, 4, 8, 10 and 11. In the charge/discharge device 1 of the second embodiment, diagnosis is performed at various timings of the timing chart shown in FIG. 3. Specifically, diagnostic processing at the time of reset driving is performed in the flow of the flowchart shown in FIG. 4, and diagnostic processing at the time of set driving is performed in the flow of the flowchart shown in FIG. 8.

First, the diagnostic processing at the time of reset driving will be described, with reference to FIGS. 4, 10 and the like.

In the charge/discharge device 1 of the second embodiment, the control unit 6 similarly executes the diagnostic processing at the time of reset driving shown in FIG. 4 when a predetermined start condition is established. The control unit 6 performs the processing of steps S1, S2, S3, S4, S6 and S12 in FIG. 4 similarly to the charge/discharge device 1 of the first embodiment. Note that the start condition for performing the diagnostic processing at the time of reset driving can be set similarly to the charge/discharge device 1 of the first embodiment, and may be, for example, the timing at which the ignition switch is turned OFF or turned ON, or an inspection timing other than these timings. Also, prior to the start of the diagnostic processing shown in FIG. 4, the latching relay 110 is kept in the set state, and the control unit 6 starts the diagnostic processing shown in FIG. 4 when the latching relay 110 is thus being kept in the set state.

Figure 3:
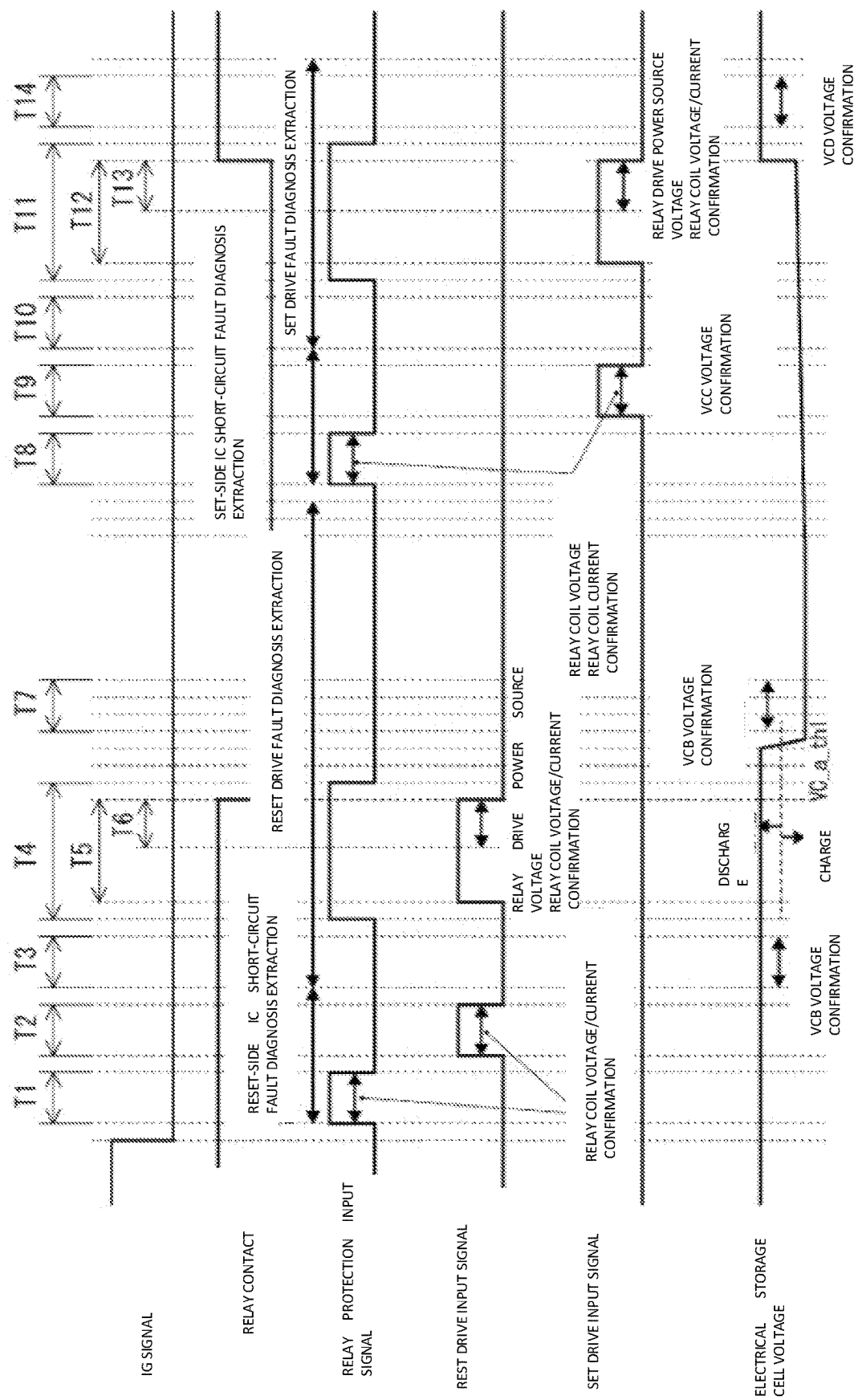
FIG. 3 is a timing chart illustrating a correspondence relationship between signals, an electrical storage cell voltage and the like in the charge/discharge device of FIG. 1.

The control unit 6, in the case of the processing proceeding to NO in S2 of the diagnostic processing of FIG. 4, performs a predetermined reset drive (S3), and, thereafter, performs the charge operation or the discharge operation (S4). The processing of these steps S3 and S4 is basically similar to the first embodiment, but will be described in more detail here. The control unit 6, in the case of performing the reset drive in S3, first acquires the voltage value (electrical storage cell voltage) of the conduction path 16 on the output side that is output from the voltage detection circuit 24, in an initial period T3 (FIG. 3). The control unit 6 continues to continuously give an OFF signal of an L level to the gates of all of the switch elements SW1, SW2 and SW3 during period T3. Note that, in the following description, the voltage value output from the voltage detection circuit 24 in period T3 is similarly given as V_C_A.

The control unit 6, during period T4 after period T3 shown in FIG. 3, continues to continuously give an ON signal (relay protection input signal) of a H level to the gate of the switch element SW1, and, furthermore, continues to continuously give an ON signal (reset drive input signal) of a H level during period T5 that overlaps with period T4 to the gate of the switch element SW3. The control unit 6, in a time slot (period T6) overlapping with the second half of the output period T5, then confirms the voltage value Va (relay drive power source voltage) of the source conduction path 50 that is output from the detection circuit 47, the current value Ib (relay coil current) that is output from the detection circuit 48, and the voltage value Vb (relay coil voltage) that is output from the detection circuit 49.

In the second embodiment, the control unit 6 similarly performs the charge/discharge operation, after the processing of S3 shown in FIG. 4 (S4). This charge/discharge operation of S4 is similar to the first embodiment, and the voltage value V_C_A confirmed in period T3 in the processing of S3 is compared with a predetermined threshold value VC_a_th1, and, in the case where the voltage value V_C_A is larger than the threshold value VC_a_th1, the charge/discharge circuit 4 is caused to perform the discharge operation for a given period (predetermined time period), and, in the case where the voltage value V_C_A is less than or equal to the threshold value VC_a_th1, the charge/discharge circuit 4 is caused to perform the charge operation for a given period (predetermined time period). The threshold value VC_a_th1 can, for example, be set to a larger value than 0 and to a lower value than the voltage (voltage at the time of full charge) of the conduction path 16 when the latching relay 110 is in the set state at the time that the electrical storage cell 104 is fully charged, and can, for example, be set to about half of the voltage at the time of full charge.

The charge/discharge circuit 4, in the case of performing discharge operation, performs a step-up operation or a step-down operation with the conduction path 16 as the conduction path on the input side and the conduction path 15 as the conduction path on the output side, for example, and sends current from the conduction path 16 side to the charge/discharge circuit 4 side. In the case where the charge/discharge circuit 4 performs the discharge operation under the control of the control unit 6 after period T5, the conduction path 16 and the electrical storage cell 104 will be in an isolated state (i.e., state in which discharge does not occur from the electrical storage cell 104 to the conduction path 16), if the latching relay 110 has switched to the reset state normally as a result of the control in period T5, and thus only the capacitor 130 is discharged by the discharge operation of the charge/discharge circuit 4. On the other hand, in the case where the latching relay 110 has not switched to the reset state due to some sort of anomaly when the control is performed in period T5, and the set state is maintained, the conduction path 16 and the electrical storage cell 104 will be in a non-isolated state (i.e., state in which discharge can occur from the electrical storage cell 104 to the conduction path 16), and thus the electrical storage cell 104 and the capacitor 130 are discharged by the discharge operation of the charge/discharge circuit 4.

The charge/discharge circuit 4, in the case of performing the charge operation, performs a step-up operation or a step-down operation with the conduction path 16 as the conduction path on the output side and the conduction path 15 as the conduction path on the input side, for example, and sends current from the charge/discharge circuit 4 to the conduction path 16. In the case where the charge/discharge circuit 4 performs the charge operation under the control of the control unit 6 after period T5, the conduction path 16 and the electrical storage cell 104 will be in an isolated state (i.e., state in which charging current does not flow from the conduction path 16 to the electrical storage cell 104), if the latching relay 110 has switched to the reset state normally as a result of the control in period T5, and thus only the capacitor 130 is charged by the charge operation of the charge/discharge circuit 4. On the other hand, in the case where the latching relay 110 does not switch to the reset state due to some sort of anomaly when control is performed in period T5, and is maintained in the set state, the conduction path 16 and the electrical storage cell 104 will be in a non-isolated state (state in which current can flow to the electrical storage cell 104 via the conduction path 16), and thus the electrical storage cell 104 and the capacitor 130 are charged by the charge operation of the charge/discharge circuit 4.

After performing the charge operation or the discharge operation in this way for predetermined time period at S4, the control unit 6 stops operation of the charge/discharge circuit 4. While the operation of the charge/discharge circuit 4 is stopped, the conduction path 15 and the conduction path 16 are maintained in a non-conduction state, and inflow of the current from the conduction path 16 to the charge/discharge circuit 4 and inflow of current from the charge/discharge circuit 4 to the conduction path 16 also stop. Even in the case where any of the charge operation or the discharge operation are performed, the voltage value (electrical storage cell voltage) of the conduction path 16 that is output from the voltage detection circuit 24 in period T7 immediately after operation of the charge/discharge circuit 4 has ended (immediately after the predetermined time period in which the charge operation or the discharge operation was performed has elapsed) is acquired. The voltage value output from the voltage detection circuit 24 in period T7 is given as V_C_B.

In the charge/discharge device 1 of the second embodiment, the control unit 6 performs the processing from S5 onward in a flow such as shown in FIG. 10, after the processing of S4. The various processing of steps S10, S12 to S17 in the flowchart shown in FIG. 10 is the same as the processing that is performed by the charge/discharge device 1 of the first embodiment in the flow of FIG. 5. With regard to step S11, however, the second condition is changed slightly from the first embodiment. Also, in the flowchart shown in FIG. 10, the portion (steps S200 to S207) that has been added to the flowchart of FIG. 5 is clearly indicated thick-lined frames and shading.

As shown in FIG. 10, with the charge/discharge device 1 of the second embodiment, it is first similarly judged, after the abovementioned processing of S4 has ended, whether the voltage difference between the voltage value V_C_A acquired in period T3 and the voltage value V_C_B acquired in period T7 satisfies a first condition (S10). Specifically, it is judged whether the absolute value of the difference (potential difference) between the voltage value V_C_A and the voltage value V_C_B exceeds a given value (predetermined potential difference), and the processing proceeds to YES in S10 if exceeded and to NO in S10 if not exceeded.

The absolute value of the difference between the voltage value V_C_A and the voltage value V_C_B corresponds to an example of "a value indicating the change in the voltage of the conduction path 16 (charge/discharge path) when the control unit 6 has given the second drive instruction and the charge or discharge instruction for predetermined time period." In the present configuration, it is judged whether the latching relay 110 has actually switched from the set state to the reset state, based on this absolute value.

In the case where the control unit 6 gives the second drive instruction (instruction for sending the second drive current) to the relay drive circuit 8 when the latching relay 110 is in the set state, the latching relay 110 will switch to the reset state in response to the second drive current flowing to the second conduction path 52, and maintain the reset state until the first drive current next flows, if the circuitry (relay drive circuit 8, latching relay 110, peripheral circuitry thereof, etc.) is in a normal state. In the case where the latching relay 110 thus switches to the reset state normally, the voltage from the capacitor 130 is applied to the conduction path 16 (charge/discharge path), rather than the output voltage (charge voltage) from the electrical storage cell 104 being applied. Accordingly, if the latching relay 110 performs the operation (reset operation) for switching to the reset state normally, the target of the charge operation or the discharge operation by the charge/discharge circuit 4 will be the capacitor 130, when the control unit 6 subsequently gives the charge instruction or the discharge instruction to the charge/discharge circuit 4 for a predetermined time period, and the capacitor 130 is charged or discharged by the conduction path 16 (charge/discharge path), and thus the change in the voltage of the conduction path 16 (charge/discharge path) per unit of time increases. In other words, when compared with the case where charging/discharging is possible between the electrical storage cell 104 and the conduction path 16, the overall capacity of the electrical storage means available for charging/discharging will decrease markedly, and the possibility of the charge voltage of the electrical storage means (i.e., the voltage of the conduction path 16) changing greatly with a smaller charging current or discharge current arises.

On the other hand, in the case where the control unit 6 gives the second drive instruction (instruction for sending the second drive current) to the relay drive circuit 8 when the latching relay 110 is in the set state, the set state is continues to be maintained, in the case where the latching relay 110 does not perform the operation (reset operation) of switching to the reset state due to some sort of anomaly, and thus the charge operation or the discharge operation by the charge/discharge circuit 4 will be performed on the capacitor 130 and the electrical storage cell 104. Thus, compared to the case where the latching relay 110 performs the reset operation normally (i.e., in the case where charging/discharging is performed on only the capacitor 130), the change in the voltage of the conduction path 16 (charge/discharge path) per unit of time will be relatively small, if the charge operation and the discharge operation are similar. In other words, the capacitance of the possible targets for charging/discharging (electrical storage cell 104 and the capacitor 130) by the charge/discharge circuit 4 increases markedly when compared with the case where the possible target for charging/discharging is only the capacitor 130, and thus the change in the charge voltage (charge voltage of the electrical storage cell 104 and the capacitor 130) when charging or discharging is performed for a predetermined time period markedly decreases compared with the case where only the capacitor 130 is the target for charging and discharging, if the charge operation and the discharge operation are similar (charge current and discharge current are comparable, and the time periods for performing charging and discharging are the same predetermined time periods).

In the present configuration, it is judged whether the latching relay 110 has switched to the reset state normally, by setting the abovementioned given value (threshold value) as a reference value for judging whether the latching relay 110 has switched to the reset state normally at the time of reset driving that is performed when the control unit 6 gives the second drive instruction to the relay drive circuit 8, and judging in S10 whether the absolute value of the difference (potential difference) between the voltage value V_C_A and the voltage value V_C_B exceeds this given value. The given value (threshold value) serving as a reference for this judgment is set to a smaller value than the change in the voltage of the conduction path 16 (i.e., the change in the charge voltage of the capacitor 130) that is envisaged when the charge/discharge circuit 4 performs the charge operation or the discharge operation with a predetermined method (method of charging or discharging executed in S4) for a predetermined time period in the case where only the capacitor 130 is targeted for charging/discharging in a state in which charging/discharging of the electrical storage cell 104 is not possible, and is set to a larger value than the change in the voltage of the conduction path 16 that is envisaged when the charge/discharge circuit 4 performs the charge operation or the discharge operation with the above predetermined method for a predetermined time period in a state where charging/discharging of the electrical storage cell 104 and the capacitor 130 is possible. Note that as the charging method (predetermined method) of the charge/discharge circuit 4 in the case where charging is executed in S4, various well-known methods can be employed, such as well-known constant voltage charging, constant current charging and constant current/constant voltage charging, and, for example, in the case where the charge/discharge circuit 4 is constituted as a non-isolated bidirectional DC-DC converter, a method for performing a voltage conversion operation (power supply operation to the conduction path 16 side) so as to step down or step up the input voltage applied to the conduction path 15 and apply a desired output voltage to the conduction path 16 is given as a favorable example. Also, as the discharging method (predetermined method) of the charge/discharge circuit 4 in the case where discharging is executed in S4, various well-known methods can similarly be employed, and, for example, a method for performing a voltage conversion operation (power discharge operation from the conduction path 16 side) so as to step down or step up an input voltage applied to the conduction path 16 and apply a desired output voltage to the conduction path 15 is given as a favorable example.

In the case where the processing proceeds to YES in S10 of FIG. 10, it is judged whether the power source voltage value Va, the current value Ib (relay coil current) and the voltage value Vb (relay coil voltage) detected during period T6 in the reset drive operation of S3 satisfy a second condition.

The normal range of the voltage value Va (relay drive power source voltage) of the source conduction path 50 is, more specifically, Vtha1<Va<Vtha2. Also, when the coil current flows via either the first conduction path 51 or the second conduction path 52, the normal range of the voltage value (coil voltage value Vb) of the conduction path through which the coil current flows is, more specifically, Vthb1<Vb<Vthb2. Furthermore, when the coil current flows via either the first conduction path 51 or the second conduction path 52, the normal range of the current value (coil current value Ib) of the conduction path through which coil current flows is, more specifically, Ith1<Ib<Ith2. In the charge/discharge device 1 of the second embodiment, the second condition of S11 is a condition that the power source voltage value Va, the voltage value Vb (relay coil voltage) and the current value Ib (relay coil current) detected during period T6 satisfy Vtha1<Va<Vtha2 (normal), Vthb1<Vb<Vthb2 (normal) and Ith1<Ib<Ith2 (normal). In the case where such a second condition is satisfied, that is, in the case where the power source voltage value Va, the coil current value Ib, and the coil voltage value Vb are all with within the normal range, the processing proceeds to YES in S11, and it is diagnosed that the relay is in a normal state at least at the time of reset driving (S12). Specifically, it can be confirmed that "the relay drive circuit 8 operated normally and the latching relay 110 switched from the set state to the reset state normally, when the control unit 6 gave the second drive instruction to the relay drive circuit 8 in the case where the latching relay 110 is in the set state" and that "the power source voltage value Va, the current value Ib (relay coil current) and the voltage value Vb (relay coil voltage) are detected normally at the time of reset driving", and it can be diagnosed that the drive units (IC 41 for relay protection, set-side IC 42, reset-side IC 43) and the detection units (detection circuits 47, 48, and 49) are operating normally at least at the time of reset driving. Note that, after the processing of S12, diagnostic processing of FIG. 4 is ended.

In the case where the control unit 6 judges, in S11 of FIG. 10, that the power source voltage value Va, the coil current value Ib and the coil voltage value Vb do not satisfy the second condition, that is, in the case where any of Ith1<Ib<Ith2, Vtha1<Va<Vtha2 and Vthb1<Vb<Vthb2 are not satisfied, the processing proceeds to NO in S11. The case where the processing proceeds to NO in S11 means that although it can be confirmed that "the relay drive circuit 8 is operating normally and the latching relay 110 has switched normally from the set state to the reset state, when the control unit 6 gives the second drive instruction to the relay drive circuit 8 in the case where the latching relay 110 is in the set state", there is a high possibility that the monitor operation of at least one of the detection units (detection circuits 47, 48 and 49) is anomalous.

The control unit 6 judges, in the case where the processing proceeds to NO in S11 of FIG. 10, whether the power source voltage value Va, the coil voltage value Vb and the coil current value Ib detected during period T6 of the reset drive operation of S3 satisfy an eleventh condition (S201). Specifically, it is judged whether either Va≤Vtha1 (low voltage) or Vtha2≤Va(s) (high voltage) is satisfied, and whether Vthb1<Vb<Vthb2 (normal) and Ith1<Ib<Ith2 (normal) are satisfied. In the case where either Va≤Vtha1 or Vtha2≤Va(s) is satisfied and Vthb1<Vb<Vthb2 and Ith1<Ib<Ith2 are both satisfied (in the case where the eleventh condition is satisfied), the processing proceeds to YES in S201, and a fault (relay drive power source voltage monitor fault) of the detection circuit 47 (part of detection unit) is diagnosed (S202). Note that, after the processing of S202, the diagnostic processing of FIG. 4 is ended.

If it is judged, at S201, that the eleventh condition is not satisfied, the processing proceeds to NO in S201, and the control unit 6 judges whether the power source voltage value Va, the coil voltage value Vb and the coil current value Ib detected during period T6 of the reset drive operation of S3 satisfy a twelfth condition (S203). The twelfth condition is a condition that either Vb≤Vthb1 (low voltage) or Vthb2≤Vb(s) (high voltage) is satisfied and that Vtha1<Va<Vtha2 (normal) and Ith1<Ib<Ith2 (normal) are satisfied. In the case where such a twelfth condition is satisfied, the processing proceeds to YES at S203, and the control unit 6 diagnoses a fault (relay coil voltage monitor fault) of the detection circuit 49 (part of detection unit) (S204). Note that, after the processing of S204, the diagnostic processing of FIG. 4 is ended.

If it is judged that the twelfth condition is not satisfied in S203, the processing proceeds to NO in S203, and the control unit 6 judges whether the power source voltage value Va, the coil voltage value Vb and the coil current value Ib detected during period T6 of the reset drive operation of S3 satisfy a thirteenth condition (S205). The thirteenth condition is a condition that either Ib≤Ith1 (low current) or Ith2≤Ib(s) (overcurrent) is satisfied, and that Vtha1<Va<Vtha2 (normal) and Vthb1<Vb<Vthb2 (normal) are satisfied. In the case where such a thirteenth condition is satisfied, the processing proceeds to YES in S205, and the control unit 6 diagnoses a fault (relay coil current monitor fault) of the detection circuit 48 (part of detection unit) (S206). Note that, after the processing of S206, the diagnostic processing of FIG. 4 is ended.

If it is judged that the thirteenth condition is not satisfied in S205, the processing proceeds to NO in S205, and the control unit 6 diagnoses faults (multiple monitor faults) of a plurality of detection units (S207). In this case, it is clear that there is a high possibility that a fault has occurred in two or all of the detection circuits 47, 48, and 49. Note that, after the processing of S207, the diagnostic processing of FIG. 4 is ended.

In this way, the control unit 6 functioning as an anomaly specification unit has a function of specifically specifying the portion in which the monitor fault has occurred, and specifies that the anomaly has occurred in at least one of the detection circuit 47 (voltage detection unit) and the detection circuits 48 and 49 (output detection units), in the case where the condition that the change in the voltage of the conduction path 16 (charge/discharge path) when the control unit 6 gives the second drive instruction (instruction for sending the second drive current) to the relay drive circuit 8 and gives the charge instruction or the discharge instruction to the charge/discharge circuit 4 for a predetermined time period exceeds a given value is satisfied (i.e., condition that the judgment result is YES in S10 is satisfied), and the condition that the power source voltage Va that is detected by the detection circuit 47 (voltage detection unit) is outside the normal range or the condition that at least one of the voltage Vb and the current Ib that are detected by the detection circuits 48 and 49 (output detection units) during the period in which the second drive instruction is being given to the relay drive circuit 8 from the control unit 6 is outside the normal range is satisfied (i.e., condition that the judgment result is NO in S11 is satisfied).

On the other hand, in the case where the processing proceeds to NO in S10, that is, in the case where the absolute value of the difference between the voltage value V_C_A and the voltage value V_C_B does not exceed a given value (predetermined potential difference), it is judged whether the power source voltage value Va, the coil current value Ib and the coil voltage value Vb detected during period T6 of the reset drive operation of S3 satisfy a third condition (S13). Specifically, it is judged whether Va>Vtha1 (normal), ib≤Ith1 (low current) and Vb≤Vthb1 (low voltage) are all satisfied, and in the case where all are satisfied, the processing proceeds to YES in S13. The case where the processing proceeds to YES in S13 means that there is a high possibility that the latching relay 110 will not switch normally due to at least one of the switch elements SW1 and SW3 not operating normally even though an instruction for turning ON the switch elements SW1 and SW3 is being given. Accordingly, in the case where the processing proceeds to YES in S13, it is diagnosed that a fault has occurred in a drive unit (specifically, at least one of the IC 41 for relay protection and the reset-side IC 43) (S200). After the processing of S200, the diagnostic processing of FIG. 4 is ended. Note that a configuration may be adopted in which, in S13, the processing proceeds to YES, in the case where Va>Vtha1 (normal) is satisfied and either Ib≤Ith1 (low current) or Vb≤Vthb1 (low voltage) is satisfied.

In this way, the control unit 6 functioning as an anomaly specification unit has a function of specifying a fault of a drive unit, and specifies that the anomaly has occurred in a drive unit (specifically, at least one of the IC 41 for relay protection and the reset-side IC 43), in the case where the condition that the change in the voltage of the conduction path 16 (charge/discharge path) when the control unit 6 gives the second drive instruction (instruction for sending the second drive current) to the relay drive circuit 8 and gives the charge instruction or the discharge instruction to the charge/discharge circuit 4 for a predetermined time period is less than or equal to a given value is satisfied (i.e., condition that the judgment result is NO in S10 is satisfied), and the condition that the power source voltage Va that is detected by the detection circuit 47 (voltage detection unit) is within the normal range and the condition that at least one of the voltage Vb and the current Ib that are detected by the detection circuits 48 and 49 (output detection units) during the period in which the second drive instruction is being given to the relay drive circuit 8 from the control unit 6 is outside the normal range is satisfied.

In the case where the third condition is not satisfied in S13 of FIG. 10, that is, in the case where none of Va>Vtha1 (normal), Ib≤Ith1 (low current) or Vb≤Vthb1 (low voltage) are satisfied, the processing proceeds to NO in S13, and it is judged whether the power source voltage value Va, the current value Ib (relay coil current) and the voltage value Vb (relay coil voltage) detected during period T6 in the reset drive operation of S3 satisfy a fourth condition (S15). Specifically, it is judged whether all of Va>Vtha1 (normal), ib>Ith1 (normal) and Vb>Vthb1 (normal) are satisfied, and, if satisfied, the processing proceeds to YES in S15, and it is diagnosed that the latching relay 110 is faulty at least at the time of reset driving (S16). After the processing of S16, the diagnostic processing of FIG. 4 is ended. In this case, since the latching relay 110 has not switched to the reset state even though an appropriate relay coil current is flowing in response to the second drive instruction being given by the control unit 6, there is a high possibility that a sticking anomaly has occurred in the latching relay 110 in which the relay cannot be changed from an ON state (set state) to an OFF state (reset state). Accordingly, in this case, it may be diagnosed that a sticking anomaly has occurred in the latching relay 110.

In the case where the fourth condition is not satisfied in S15 of FIG. 10, that is, in the case where none of Va>Vtha1 (normal), Ib>Ith1 (normal) and Vb>Vthb1 (normal) are satisfied, the processing proceeds to NO in S15, and it is diagnosed that the harness is faulty at least at the time of reset driving (S17). After the processing of S17, the diagnostic processing of FIG. 4 is ended. Note that, in S17, it may be diagnosed that a portion excluding the relay drive circuit 8 and the latching relay 110 is faulty at least at the time of reset driving.

Here, effects relating to the reset drive diagnosis will be illustrated.

With the present configuration, in the case where the reset drive diagnosis shown in FIG. 4 is performed when the latching relay 110 is in the set state, and the control unit 6 gives the second drive instruction to the relay drive circuit 8 in S3, the latching relay 110 holds the reset state if the circuitry is in a normal state, and thus the voltage from the capacitor 130 is applied to the conduction path 16 (charge/discharge path), rather than the output voltage (charge voltage) from the electrical storage cell 104 being applied. In the case where the control unit 6 gives the charge instruction or the discharge instruction for a predetermined time period in S4 when in such a state, the target of the charge operation or the discharge operation by the charge/discharge circuit 4 will be the capacitor 130 in S4 if the latching relay 110 performs the reset operation normally in S3, and the capacitor 130 is charged or discharged via the conduction path 16 (charge/discharge path), and thus the change in the voltage of the conduction path 16 (charge/discharge path) per unit of time increases. Conversely, in the case where the latching relay 110 does not perform the reset operation normally in S3, the target of the charge operation or the discharge operation by the charge/discharge circuit 4 in S4 will be the capacitor 130 and the electrical storage cell 104, and thus the change in the voltage of the conduction path 16 (charge/discharge path) per unit of time becomes extremely small as compared with the case where the latching relay 110 performs the reset operation normally. Accordingly, a given value (threshold value) is set as a reference value for judging the state of the latching relay 110, and if it is judged as in S10 whether the change in the voltage of the conduction path 16 (charge/discharge path) is less than or equal to a given value when the control unit 6 gives the second drive instruction as in S3 and gives the charge instruction or the discharge instruction for a predetermined time period as in S4, it can be judged more accurately whether the latching relay 110 performs the reset operation normally.

Also, in the case where the change in the voltage of the conduction path 16 (charge/discharge path) is less than or equal to a given value when the control unit 6 gives the second drive instruction as in S3 and gives the charge instruction or the discharge instruction for a predetermined time period as in S4 (i.e., the case where there is a high possibility that the latching relay 110 will not perform the reset operation normally, and the judgment result will be NO in S10), there is a high possibility that cause of the latching relay 110 not performing the reset operation normally lies in the drive units (specifically, at least one of the IC 41 for relay protection and the reset-side IC 43), in the case where the power source voltage Va that is detected by the detection circuit 47 (voltage detection unit) is within the normal range, and at least one of the voltage Vb and the current Ib that are detected by the detection circuits 48 and 49 (output detection units) during the period (period T6) in which the second drive instruction is being given to the relay drive circuit 8 from the control unit 6 is outside the normal range (in the case of YES in S13 of FIG. 10). In other words, since an anomaly has occurred in a drive unit even though the power source voltage Va is being supplied normally, it can be said that there is a high possibility that the second drive current will not flow even if the second drive instruction is given. Therefore, according to the above method, the anomaly of such a drive unit can be specified.

Also, in the case where the change in the voltage of the conduction path 16 (charge/discharge path) exceeds a given value when the control unit 6 gives the second drive instruction in S3 and gives the charge instruction or the discharge instruction for a predetermined time period in S4 (i.e., in the case where there is a high possibility that the latching relay 110 will perform the reset operation normally, and the case of YES in S10), it can be said that there is a high possibility that the detection result of the detection circuit 47 (voltage detection unit) or at least one of the detection circuits 48 and 49 (output detection units) indicates an anomalous value, even though the state is one in which the latching relay 110 will perform the reset operation normally (i.e., state in which the power source voltage and the second drive current are supplied normally), in the case where the condition that the power source voltage Va that is detected by the detection circuit 47 (voltage detection unit) is outside the normal range or the condition that at least one of the voltage Vb and the current Ib that are detected by the detection circuits 48 and 49 (output detection units) during the period (period T6) in the second drive instruction is being given to the relay drive circuit 8 from the control unit 6 is outside the normal range is satisfied (i.e., the case of NO in S11 of FIG. 10). Therefore, according to the above method, the anomaly of such a detection unit can be specified.

Next, the diagnostic processing at the time of set driving will be described, with reference to FIGS. 8, 11 and the like.

In the charge/discharge device 1 of the second embodiment, the control unit 6 executes diagnostic processing at the time of set driving shows in FIG. 8 when a predetermined start condition is established. The control unit 6 performs the processing of steps S21, S22, S23, S25 and S32 in FIG. 8 similarly to the charge/discharge device 1 of the first embodiment. Note that the start condition for performing the diagnostic processing at the time of set driving can be set similarly to the charge/discharge device 1 of the first embodiment, and may be, for example, the timing at which the ignition switch is turned OFF or turned ON, or an inspection timing other than these timings. For example, the diagnostic processing at the time of set driving may be performed following the diagnostic processing at the time of reset driving in FIG. 4. Also, prior to the start of the diagnostic processing shown in FIG. 8, the latching relay 110 is kept in the reset state, and the control unit 6 starts the diagnostic processing shown in FIG. 8 when the latching relay 110 is thus being kept in the reset state.

The charge/discharge device 1 of the second embodiment performs processing from S23 onward shown in FIG. 8 in a flow such as shown in FIG. 11 after the processing of S23. In the flowchart shown in FIG. 11, the processing of steps S30 and S32 to S40 is the same as the processing that is performed in the flow of FIG. 9 by the charge/discharge device 1 of the first embodiment. With regard to step S31, however, the sixth condition is slightly changed from the first embodiment. Also, in the flowchart shown in FIG. 11, the portion (steps S230 to S237) that has been added to the flowchart of FIG. 9 is clearly indicated thick-lined frames and shading.

As shown in FIG. 11, in the processing of S30 that is performed after S23, the voltage value (electrical storage cell voltage) of the conduction path 16 on the output side that is output from the voltage detection circuit 24 is acquired in period T14 (FIG. 3) after turning OFF the switch elements SW1 and SW2. Hereinafter, the voltage value output from the voltage detection circuit 24 in period T14 will be described as V_C_D. In S30, after acquiring the voltage value V_C_D in period T14, this voltage value V_C_D is compared with the voltage value V_C_C acquired in period T10 (FIG. 3), and it is judged whether the voltage difference between the voltage value V_C_C and the voltage value V_C_D satisfies a fifth condition (S30). Specifically, it is judged whether the absolute value of the difference (potential difference) between the voltage value V_C_C and the voltage value V_C_D exceeds a given value (predetermined potential difference), and the processing proceeds to YES in S30 if the given value is exceeded and proceeds to NO in S30 if the given value is not exceeded.

The time slot of period T10 is a period in which the latching relay 110 is held in the reset state prior to the control unit 6 giving the first drive instruction. Thus, in this period T10, the electrical storage cell 104 will be isolated and the charge voltage of the electrical storage cell 104 will not applied to the conduction path 16. The voltage value V_C_C acquired in period T10 is the voltage of the conduction path 16 at the time of such a state. Also, when the latching relay 110 operates normally in response to the first drive instruction in the case where the first drive instruction is given by the control unit 6 when in such a state, the latching relay 110 switches from the reset state to the set state and holds the set state, and thus the output voltage (charge voltage) from the electrical storage cell 104 is applied to the conduction path 16 (charge/discharge path). Accordingly, in the case where the absolute value of the difference (potential difference) between the voltage value V_C_C and the voltage value V_C_D exceeds the given value (predetermined potential difference), there is a high possibility that the latching relay 110 has switched from the reset state to the set state, and, in S30, the processing proceeds to YES in such a case. Conversely, in the case where the absolute value of the difference (potential difference) between the voltage value V_C_C and the voltage value V_C_D does not exceed the given value (predetermined potential difference), there is a high possibility that the latching relay 110 has not switched to the set state, or that the latching relay 110 has switched but the potential difference between when the output voltage (charge voltage) of the electrical storage cell 104 is applied and is not applied is small. In S30, the processing proceeds to NO in such a case.

In the case where the processing proceeds to YES in S30 of FIG. 11, it is judged whether the power source voltage value Va, the current value Ib (relay coil current) and the voltage value Vb (relay coil voltage) detected during period T13 (FIG. 3) in the set drive operation of S23 satisfy a sixth condition (S31).

As mentioned above, the normal range of the voltage value Va (relay drive power source voltage) of the source conduction path 50 is Vtha1<Va<Vtha2, the normal range of the voltage value (coil voltage value Vb) of the conduction path through which the coil current flows when the coil current flows via either the first conduction path 51 or the second conduction path 52 is Vthb1<Vb<Vthb2, and the normal range of the current value (coil current value Ib) of the conduction path through which coil current flows when the coil current flows via either the first conduction path 51 or the second conduction path 52 is Ith1<Ib<Ith2. In the charge/discharge device 1 of the second embodiment, the sixth condition of S31 is a condition that the power source voltage value Va, the voltage value Vb (relay coil voltage) and the current value Ib (relay coil current) detected during period T13 satisfy Vtha1<Va<Vtha2 (normal), Vthb1<Vb<Vthb2 (normal) and Ith1<Ib<Ith2 (normal). In the case where such a sixth condition is satisfied, that is, in the case where the power source voltage value Va, the coil current value Ib and the coil voltage value Vb are all normal ranges, the processing proceeds to YES in S31, and it is diagnosed that the relay is in a normal state at least at the time of set driving (S32). Specifically, it can be confirmed that "when the control unit 6 gave the first drive instruction to the relay drive circuit 8 in the case where the latching relay 110 is in the reset state, the relay drive circuit 8 operated normally and the latching relay 110 switched from the reset state to the set state normally" and that "the power source voltage value Va, the current value Ib (relay coil current) and the voltage value Vb (relay coil voltage) are detected normally at the time of set driving", and it can be diagnosed that the drive units (the IC 41 for relay protection, the set-side IC 42, the reset-side IC 43) and the detection units (detection circuits 47, 48, and 49) are operating normally at least at the time of set driving. Note that, after the processing of S32, the diagnostic processing of FIG. 8 is ended.

In the case where the control unit 6, in S31 of FIG. 11, judges that the power source voltage value Va, the coil current value Ib and the coil voltage value Vb do not satisfy the sixth condition, that is, in the case where none of Vtha1<Va<Vtha2, Vthb1<Vb<Vthb2 and Ith1<Ib<Ith2 are satisfied, the processing proceeds to NO in S31. The case where processing proceeds to NO in S31 means that although it can be confirmed that "when the control unit 6 gave the first drive instruction to the relay drive circuit 8 in the case where the latching relay 110 is in the reset state, the relay drive circuit 8 operated normally and the latching relay 110 switched from the reset state to the set state normally", there is a high possibility the monitor operation of at least one of the detection units (detection circuits 47, 48, and 49) is anomalous.

The control unit 6, in the case where the processing proceeds to NO in S31 of FIG. 11, judges whether the power source voltage value Va, the coil voltage value Vb and the coil current value Ib detected during period T13 of set drive operation of S23 satisfy a fourteenth condition (S231). Specifically, it is judged whether either Va≤Vtha1 (low voltage) or Vtha2≤Va(s) (high voltage) is satisfied, and whether Vthb1<Vb<Vthb2 (normal) and Ith1<Ib<Ith2 (normal) are satisfied. In the case where either Va≤Vtha1 or Vtha2≤Va(s) is satisfied and Vthb1<Vb<Vthb2 and Ith1<Ib<Ith2 are satisfied (in the case where the fourteenth condition is satisfied), the processing proceeds to YES in S231, and a fault (relay drive power source voltage monitor fault) of the detection circuit 47 (part of detection unit) (S232) is diagnosed. After the processing of S232, the diagnostic processing of FIG. 8 is ended.

If it is judged in S231 that the fourteenth condition is not satisfied, the processing proceeds to NO in S231, and the control unit 6 judges whether the power source voltage value Va, the coil voltage value Vb and the coil current value Ib detected during period T13 of set drive operation of S23 satisfy a fifteenth condition (S233). The fifteenth condition is a condition that either Vb≤Vthb1 (low voltage) or Vthb2≤Vb(s) (high voltage) is satisfied and that Vtha1<Va<Vtha2 (normal) and Ith1<Ib<Ith2 (normal) are satisfied. In the case where such a fifteenth condition is satisfied, the processing proceeds to YES in S233, and the control unit 6 diagnoses a fault (relay coil voltage monitor fault) of the detection circuit 49 (part of detection unit) (S234). After the processing of S234, the diagnostic processing of FIG. 8 is ended.

In the case where the control unit 6 judges in S233 that the fifteenth condition is not satisfied, the processing proceeds to NO in S233, it is judged whether the power source voltage value Va, the coil voltage value Vb and the coil current value Ib detected during period T16 of set drive operation of S23 satisfy a sixteenth condition (S235). The sixteenth condition is a condition that either Ib≤Ith1 (low current) or Ith2≤b (overcurrent) is satisfied, and Vtha1<Va<Vtha2 (normal) and Vthb1<Vb<Vthb2 (normal) are satisfied. In the case where such a sixteenth condition is satisfied, the processing proceeds to YES in S235, and the control unit 6 diagnoses a fault (relay coil current monitor fault) of the detection circuit 48 (part of detection unit) (S236). After the processing of S236, the diagnostic processing of FIG. 8 is ended.

In the case where it is judged in S235 that the sixteenth condition is not satisfied, the processing proceeds to NO in S235, and the control unit 6 diagnoses a fault (monitor multiplex fault) of a plurality of detection units, (S237). In this case, it is clear that there is a high possibility that a fault has occurred in two or all of the detection circuits 47, 48, and 49. After the processing of S237, the diagnostic processing of FIG. 8 is ended.

In this way, the control unit 6 functioning as an anomaly specification unit has a function of specifically specifying the portion in which a monitor fault has occurred, and specifies that the anomaly has occurred in at least one of the detection circuit 47 (voltage detection unit) and the detection circuits 48 and 49 (output detection units), in the case where the condition that the difference between the voltage of the conduction path 16 (charge/discharge path) when the relay is in the reset state before the control unit 6 gives the first drive instruction to the relay drive circuit 8 and the voltage of the conduction path 16 (charge/discharge path) after the first drive instruction is given exceeds a given value is satisfied, and in the case where the condition that the power source voltage Va that is detected by the detection circuit 47 (voltage detection unit) is outside the normal range and the condition that at least one of the voltage Vb and the current Ib that are detected by the detection circuits 48 and 49 (output detection units) during the period in which the first drive instruction is being given to the relay drive circuit 8 from the control unit 6 is outside the normal range is satisfied.

On the other hand, in the case where the processing proceeds to NO in S30, that is, in the case where the absolute value of the difference between the voltage value V_C_C and the voltage value V_C_D does not exceed a given value (predetermined potential difference), it is judged whether the power source voltage value Va, the coil current value Ib and the coil voltage value Vb detected during period T13 (FIG. 3) satisfy a seventh condition (S33). Specifically, it is judged whether Va>Vtha1 (normal), ib≤Ith1 (low current) and Vb≤Vthb1 (low voltage) are all satisfied, and, if satisfied, the processing proceeds to YES in S33. The case where the processing proceeds to YES in S33 means that there is a high possibility that the latching relay 110 will not switch normally due to at least one of the switch elements SW1 and SW2 not operating normally even though an instruction for turning ON the switch elements SW1 and SW2 is being given. Accordingly, in the case where the processing proceeds to YES in S33, it is diagnosed that a fault has occurred in a drive unit (specifically, at least one of the IC 41 for relay protection and the set-side IC 42) (S230). After the processing of S230, the diagnostic processing of FIG. 8 is ended. Note that a configuration may be adopted in which, in S33, the processing proceeds to YES in the case where Va>Vtha1 (normal) is satisfied and either Ib≤Ith1 (low current) or Vb≤Vthb1 (low voltage) is satisfied.

In this way, the control unit 6 functioning as an anomaly specification unit has a function of specifying a fault of a drive unit, and specifies that the anomaly has occurred in a drive unit (specifically, at least one of the IC 41 for relay protection and the set-side IC 42), in the case where the condition that the difference between the voltage of the conduction path 16 (charge/discharge path) when the relay is in the reset state before the control unit 6 gives the first drive instruction to the relay drive circuit 8 and the voltage of the conduction path 16 (charge/discharge path) after the first drive instruction is given is less than or equal to a given value is satisfied, and the condition that the power source voltage Va that is detected by the detection circuit 47 (voltage detection unit) is within the normal range and at least one of the voltage Vb and the current Ib that are detected by the detection circuits 48 and 49 (output detection units) during the period in which the first drive instruction is being given to the relay drive circuit 8 from the control unit 6 is outside the normal range is satisfied.

In the case where the seventh condition is not satisfied in S33 of FIG. 11 (normal), that is, in the case where none of Va>Vtha1 (normal), Ib≤Ith1 (low current) and Vb≤Vthb1 (low voltage) are satisfied, the processing proceeds to NO in S33, and it is judged whether the power source voltage value Va, the current value Ib (relay coil current) and the voltage value Vb (relay coil voltage) detected during period T13 (FIG. 3) satisfy an eighth condition (S35). Specifically, it is judged whether all of Va>Vtha1 (normal), ib>Ith1 (normal) and Vb>Vthb1 (normal) are satisfied. In the case where any thereof are not satisfied, the processing proceeds to NO in S35, and it is diagnosed that the harness is faulty at least at the time of set driving (S41). After the processing of S41, the diagnostic processing of FIG. 8 is ended. Note that, in S41, it may be diagnosed that a portion excluding the relay drive circuit 8 and the latching relay 110 is faulty.

In S35 of FIG. 11, in the case where it is judged that all of Va>Vtha1 (normal), ib>Ith1 (normal) and Vb>Vthb1 (normal) are satisfied, the processing proceeds to YES in S35, the voltage value V_C_D confirmed in period T14 is compared with a predetermined threshold value VC_a_th2, and it is judged whether a ninth condition is satisfied. Specifically, in the case where the voltage value V_C_D is larger than the threshold value VC_a_th2, the processing proceeds to YES in S36, the charge/discharge circuit 4 is caused to perform the discharge operation for a given period, and the electrical storage cell 104 is discharged (S37). Conversely, in the case where the voltage value V_C_D is less than or equal to the threshold value VC_a_th2, the processing proceeds to NO in S36, the charge/discharge circuit 4 is caused to perform the charge operation for a given period, and the electrical storage cell 104 is charged (S38). Note that the threshold value VC_a_th2 can, for example, be set to a value larger than 0 and smaller than the charge voltage of the electrical storage cell 104 when fully charged. If the latching relay has switched to the set state normally as a result of the set drive of S23, in discharge operation of S37, the electrical storage cell 104 will be discharged and the voltage of the conduction path 16 will fall with the elapse of the discharge time period. Also, if the latching relay has switched to the set state normally as a result of the set drive of S23, the electrical storage cell 104 will be charged by the charge operation of S38, and the voltage of the conduction path 16 will rise with the elapse of the charge time period. Even in the case where one of the charge operation (S38) and the discharge operation (S37) is performed, the charge operation or the discharge operation is stopped after performing charging or discharging for a predetermined time period, and the voltage value (electrical storage cell voltage) of the conduction path 16 on the output side that is output from the voltage detection circuit 24 in period T15 immediately after the operation has ended is acquired. The voltage value output from the voltage detection circuit 24 in period T15 after stopping the discharge operation or the charge operation is given as V_C_E.

After S37 or S38, it is then judged whether the difference (potential difference) between the voltage value V_C_D acquired in period T14 and the voltage value V_C_E acquired in period T15 satisfies a tenth condition (S39). Specifically, it is judged whether the absolute value of the difference (potential difference) between the voltage value V_C_D and the voltage value V_C_E has exceeded a given value (predetermined potential difference), and the processing proceeds to YES in S39 if the given value has been exceeded and to NO in S39 if the given value has not been exceeded. In the case where the processing proceeds to YES in S39, it is diagnosed that the relay is in a normal state at least at the time of set driving (S32), and the diagnostic processing of FIG. 8 is ended.

In the case where the processing proceeds to NO in S39, it is diagnosed that the latching relay 110 is faulty at least at the time of set driving (S40). After the processing of S40, the diagnostic processing of FIG. 8 is ended. Note that, in this case, it may be diagnosed that a sticking anomaly has occurred in the latching relay 110 in which the relay cannot be changed from an OFF state (reset state).

Here, effects relating to the set drive diagnosis will be illustrated.

With the present configuration, when diagnosis at the time of set driving as shown in FIG. 8 is performed, the latching relay 110 holds the reset state before the control unit 6 gives the first drive instruction, and holds the set state after the first drive instruction is given, in the case where the latching relay 110 operates normally in S23, and thus the conduction path 16 (charge/discharge path) will switch from a state in which the output voltage (charge voltage) from the electrical storage cell 104 is not applied to a state in which the output voltage is applied. Conversely, in the case where the latching relay 110 does not operate normally in S23, the latching relay 110 will not switch normally before and after the control unit 6 gives the first drive instruction, and thus the voltage of the conduction path 16 (charge/discharge path) will not change greatly. Accordingly, by setting a given value (threshold value) as a reference value for judging the state of the latching relay 110, and judging whether the difference between the voltage of the conduction path 16 (charge/discharge path) before the first drive instruction is given by the control unit 6 and the voltage of the conduction path 16 (charge/discharge path) after the first drive instruction is given is less than or equal to a given value, it can be judged more accurately whether the latching relay 110 will operates normally. In the case where the difference between the voltage of the conduction path 16 (charge/discharge path) before the first drive instruction is given by the control unit 6 and the voltage of the conduction path 16 (charge/discharge path) after the first drive instruction is given is less than or equal to a given value (i.e., the case where there is a high possibility that the latching relay 110 perform the set operation normally), there is a high possibility that cause of the latching relay 110 not performing the set operation normally lies in the drive units (specifically, at least one of the IC 41 for relay protection and the set-side IC 42), in the case where the power source voltage Va detected by the detection circuit 47 (voltage detection unit) is within the normal range, and the voltage Vb and the current Ib that are detected by the detection circuits 48 and 49 (output detection units) during the period (period T13) in which the first drive instruction is given to the relay drive circuit 8 from the control unit 6 is outside the normal range. In other words, it can be said that there is a high possibility that the first drive current will not flow even if the first drive instruction is given, since the anomaly has occurred in a drive unit even though the power source voltage is being supplied normally. Therefore, according to the above method, the anomaly of such a drive unit can be specified.

Also, in the case where the difference between the voltage of the conduction path 16 (charge/discharge path) before the first drive instruction is given by the control unit 6 and the voltage of the conduction path 16 (charge/discharge path) after the voltage is given exceeds a given value (i.e., in the case where there is a high possibility that the latching relay 110 will perform the set operation normally), it can be said that there is a high possibility that the detection result of at least one of the detection circuit 47 (voltage detection unit) and the detection circuits 48 and 49 (output detection units) indicates an anomalous value, even though the latching relay 110 will perform the set operation normally, in the case where the condition that the power source voltage Va that is detected by the detection circuit 47 (voltage detection unit) is outside the normal range and at least one of the voltage Vb and the current Ib detected by the detection circuits 48 and 49 (output detection units) during the period (period T13) in which the first drive instruction is given to the relay drive circuit 8 from the control unit 6 is outside the normal range is satisfied. Therefore, according to the above method, the anomaly of such a detection unit can be specified.

Other Embodiments

The present invention is not limited to the embodiments illustrated using the above description and drawings, and embodiments such as the following are encompassed in the technical scope of the invention, for example.

(1) Although a lead battery was illustrated as the primary power source 120 in the first embodiment, a well-known electrical storage means other than a lead battery may be employed, in the abovementioned embodiments or any modified examples of the abovementioned embodiments. Also, although an electrical storage cell such as a lithium-ion cell and an electric double-layer capacitor were illustrated as the electrical storage cell 104 corresponding to a secondary power source, a well-known electrical storage means other than an electrical storage cell may be employed.

(2) Although, in FIG. 1, electrical components (loads, etc.) that are connected to the conduction path 15 on the input side or the conduction path 16 on the output side were omitted, in the abovementioned embodiments or any modified examples of the abovementioned embodiments, various devices and electronic components can be connected to the conduction path 15 on the input side and the conduction path 16 on the output side.

(3) Although, in FIG. 1, the latching relay 110 was connected between the electrical storage cell 104 and ground, in the abovementioned embodiments or any modified examples of the abovementioned embodiments, the latching relay may be interposed between the electrical storage cell 104 and the capacitor 130 on the conduction path 16 on the output side.

(4) Although, in the first embodiment, a method for detecting the voltage and the current that are respectively given to the first conduction path 51 and the second conduction path 52 was illustrated as a method for detecting the output that is provided from the relay drive circuit 8 to the latching relay 110, in the abovementioned embodiments or any modified examples of the abovementioned embodiments, a method for detecting the voltages that are respectively provided to the first conduction path 51 and the second conduction path 52, or a method for detecting the currents that are respectively provided to the first conduction path 51 and the second conduction path 52 may be employed.

(5) Although, in the abovementioned first embodiment, the current threshold value Ith1 and the voltage threshold value Vthb1 were illustrated as output threshold values used in S2, in the abovementioned embodiments or any modified examples of the abovementioned embodiments, the current threshold values used in the judgment of S2 can be set to various values that are greater than zero and smaller than the values of the first drive current and the second drive current that flow at the time of the normal state. Similarly, the voltage threshold values used in the judgment of S2 can be set to various values that are greater than zero and smaller than the voltage value that is detected with the detection circuit 49 when the first drive current or the second drive current flows in the normal state.

(6) Although, in the abovementioned first embodiment, the current threshold value Ith1 and the voltage threshold value Vthb1 were illustrated as output threshold values used in the judgments of S13, S203, S33, S233 and the like, in the abovementioned embodiments or any modified examples of the abovementioned embodiments, the current threshold values used in the judgments of S13, S203, S33, and S233 can be set to various values that are greater than zero and smaller than the values of the first drive current and the second drive current that flows in the normal state. Similarly, the voltage threshold values used in the judgments of S13, S203, S33, S233 and the like can be set to various values that are great than zero and smaller than the voltage value that is detected with the detection circuit 49 in the case where the first drive current or the second drive current flows in the normal state.

LIST OF REFERENCE NUMERALS

FIGURES
FIG. 1
4 CHARGE/DISCHARGE CIRCUIT
6 CONTROL UNIT
7 CONTROL CIRCUIT
8 RELAY DRIVE CIRCUIT
22 ELECTRICAL STORAGE CELL-SIDE CURRENT DETECTION CIRCUIT
24 ELECTRICAL STORAGE CELL-SIDE VOLTAGE DETECTION CIRCUIT
32 BATTERY-SIDE CURRENT DETECTION CIRCUIT
34 BATTERY-SIDE VOLTAGE DETECTION CIRCUIT
104 ELECTRICAL STORAGE CELL
120 PRIMARY POWER SOURCE (LEAD BATTERY)
異常特定部 ANOMALY SPECIFICATION UNIT)
リレー保護入力 RELAY PROTECTION INPUT
セット駆動入力 SET DRIVE INPUT
リセット駆動入力 RESET DRIVE INPUT
リレー駆動電源 RELAY DRIVE POWER SOURCE
電圧モニター VOLTAGE MONITOR
リレーコイル電圧モニター RELAY COIL VOLTAGE MONITOR
リレーコイル電流モニター RELAY COIL CURRENT MONITOR
リレー駆動用 IC FOR RELAY DRIVE
セット駆動出力 SET DRIVE OUTPUT
リセット駆動出力 RESET DRIVE OUTPUT
FIG. 2
8 RELAY DRIVE CIRCUIT
41 IC FOR RELAY PROTECTION
42 SET-SIDE IC
43 RESET-SIDE IC
44 CONTROL CIRCUIT
45 CONTROL CIRCUIT
46 CONTROL CIRCUIT
47 DETECTION CIRCUIT
48 DETECTION CIRCUIT
49 DETECTION CIRCUIT
リレー駆動電源 RELAY DRIVE POWER SOURCE
リレー保護入力 RELAY PROTECTION INPUT
セット駆動入力 SET DRIVE INPUT
リセット駆動入力 RESET DRIVE INPUT
リセット駆動電源電圧モニター RESET DRIVE POWER SOURCE VOLTAGE MONITOR
リレーコイル電流モニター RELAY COIL CURRENT MONITOR
リレーコイル電圧モニター RELAY COIL VOLTAGE MONITOR
FIG. 3
IG 信号
リレー接点 RELAY CONTACT
リレー保護入力信号 RELAY PROTECTION INPUT SIGNAL
リセット駆動入力信号 RESET DRIVE INPUT SIGNAL
セット駆動入力信号 SET DRIVE INPUT SIGNAL
蓄電池電圧 ELECTRICAL STORAGE CELL VOLTAGE
リセット側ICショート故障診断抽出 RESET-SIDE IC SHORT-CIRCUIT FAULT DIAGNOSIS EXTRACTION
リセット駆動故障 RESET DRIVE FAULT
診断抽出 DIAGNOSIS EXTRACTION
セット側ICショート故障診断抽出 SET-SIDE IC SHORT-CIRCUIT FAULT DIAGNOSIS EXTRACTION
セット駆動故障 SET DRIVE FAULT
リレーコイル電圧・電流 RELAY COIL VOLTAGE/CURRENT
確認 CONFIRMATION
リレー駆動電源電圧 RELAY DRIVE POWER SOURCE VOLTAGE
リレーコイル電圧 RELAY COIL VOLTAGE
リレーコイル電流 RELAY COIL CURRENT
"V_C_A" 電圧 "V_C_A" VOLTAGE
放電 DISCHARGE
充電 CHARGE
"V_C_B" 電圧 "V_C_B" VOLTAGE
"V_C_C" 電圧 "V_C_C" VOLTAGE
リレー駆動電源電圧 RELAY DRIVE POWER SOURCE VOLTAGE
リレーコイル電圧・電流 RELAY COIL VOLTAGE/CURRENT
"V_C_D" 電圧 "V_C_D" VOLTAGE
FIG. 4

リセット駆動診断開始 RESET DRIVE DIAGNOSIS START
S1 IC DRIVE
S2 IC SHORT-CIRCUIT FAULT?
S3 RESET DRIVE
S4 CHARGE OR DISCHARGE ELECTRICAL STORAGE CELL
S5 RESET DRIVE FAULT?
S6 (1) RELAY DRIVE CIRCUIT FAULT ASCERTAINMENT
リレー駆動用ICショート故障 SHORT-CIRCUIT FAULT OF IC FOR RELAY DRIVE
S12 RESET DRIVE NORMAL
S14 (1) RELAY DRIVE CIRCUIT FAULT ASCERTAINMENT
リレー駆動用ICオープン故障 OPEN-CIRCUIT FAULT OF IC FOR RELAY DRIVE
リレー駆動電源電圧モニター故障 RELAY DRIVE POWER SOURCE VOLTAGE MONITOR FAULT
リレーコイル電圧モニター故障 RELAY COIL VOLTAGE MONITOR FAULT
リレーコイル電流モニター故障 RELAY COIL CURRENT MONITOR FAULT
S16 (2) LATCH RELAY FAULT ASCERTAINMENT
リレーON固着 RELAY ON STICKING
S17 (3) HARNESS FAULT ASCERTAINMENT
ハーネス断線 HARNESS DISCONNECTION
ハーネス地絡 HARNESS GROUNDING
リレー駆動電源電圧ハーネス断線 RELAY DRIVE POWER SOURCE HARNESS DISCONNECTION
FIG. 5
S4 CHARGING OR DISCHARGING OF ELECTRICAL STORAGE CELL
S10 POTENTIAL DIFFERENCE BETWEEN "V_C_A" AND "V_C_B" SATISFIES 1ST CONDITION?
S11 RELAY DRIVE POWER SOURCE VOLTAGE, COIL VOLTAGE AND COIL CURRENT SATISFY 2ND CONDITION?
S12 RESET DRIVE NORMAL
S13 RELAY DRIVE POWER SOURCE VOLTAGE, COIL VOLTAGE AND COIL CURRENT SATISFY 3RD CONDITION?
S14 (1) RELAY DRIVE CIRCUIT FAULT CONFIRMATION
S15 RELAY DRIVE POWER SOURCE VOLTAGE, COIL VOLTAGE AND COIL CURRENT SATISFY 4TH CONDITION?
S16 (2) LATCH RELAY FAULT CONFIRMATION
S17 (3) HARNESS FAULT CONFIRMATION
FIG. 6
正常時 AT NORMAL TIME
リレー保護入力信号 RELAY PROTECTION INPUT SIGNAL
リセット駆動入力信号 RESET DRIVE INPUT SIGNAL
リレーコイル電圧 RELAY COIL VOLTAGE
リレーコイル電流 RELAY COIL CURRENT
FIG. 7
正常時 AT NORMAL TIME
真理値表 TRUTH TABLE
リレー保護 RELAY PROTECTION
リセット駆動 RESET DRIVE
コイル電圧 COIL VOLTAGE
コイル電流 COIL CURRENT
FIG. 8
セット駆動診断開始 SET DRIVE DIAGNOSIS START
S21 IC DRIVE
S22 IC SHORT-CIRCUIT FAULT?
S23 SET DRIVE
S24 SET DRIVE FAULT?
S25 (1) RELAY DRIVE CIRCUIT FAULT ASCERTAINMENT
リレー駆動用ICショート故障 SHORT-CIRCUIT FAULT OF IC FOR RELAY DRIVE
S32 SET DRIVE NORMAL
S34 (1) RELAY DRIVE CIRCUIT FAULT ASCERTAINMENT
リレー駆動用ICオープン故障 OPEN-CIRCUIT FAULT OF IC FOR RELAY DRIVE
リレー駆動電源電圧モニター故障 RELAY DRIVE POWER SOURCE VOLTAGE MONITOR FAULT
リレーコイル電圧モニター故障 RELAY COIL VOLTAGE MONITOR FAULT
リレーコイル電流モニター故障 RELAY COIL CURRENT MONITOR FAULT
S40 (2) LATCH RELAY FAULT ASCERTAINMENT
リレーOFF固着 RELAY OFF STICKING
S41 (3) HARNESS FAULT ASCERTAINMENT
ハーネス断線 HARNESS DISCONNECTION
ハーネス地絡 HARNESS GROUNDING
リレー駆動電源電圧ハーネス断線 RELAY DRIVE POWER SOURCE HARNESS DISCONNECTION
FIG. 9
S23 SET DRIVE
S30 POTENTIAL DIFFERENCE BETWEEN "V_C_C" AND "V_C_D" SATISFIES 5TH CONDITION?
S31 RELAY DRIVE POWER SOURCE VOLTAGE, COIL VOLTAGE AND COIL CURRENT SATISFY 6TH CONDITION?
S32 SET DRIVE NORMAL
S33 RELAY DRIVE POWER SOURCE VOLTAGE, COIL VOLTAGE AND COIL CURRENT SATISFY 7TH CONDITION?
S34 (1) RELAY DRIVE CIRCUIT FAULT CONFIRMATION
S35 RELAY DRIVE POWER SOURCE VOLTAGE, COIL VOLTAGE AND COIL CURRENT SATISFY 8TH CONDITION?
S36 "V_C" VOLTAGE ("V_C_D") SATISFIES 9TH CONDITION?
S37 DISCHARGE OPERATION
S38 CHARGE OPERATION
S39 POTENTIAL DIFFERENCE BETWEEN "V_C_D" AND "V_C_E" SATISFIES 10TH CONDITION?
S40 (2) LATCH RELAY FAULT CONFIRMATION
S41 (3) HARNESS FAULT CONFIRMATION
FIG. 10
S4 CHARGING OR DISCHARGING OF ELECTRICAL STORAGE CELL
S10 POTENTIAL DIFFERENCE BETWEEN "V_C_A" AND "V_C_B" SATISFIES 1ST CONDITION?
S11 RELAY DRIVE POWER SOURCE VOLTAGE, COIL VOLTAGE AND COIL CURRENT SATISFY 2ND CONDITION?
S12 RESET DRIVE NORMAL
S13 RELAY DRIVE POWER SOURCE VOLTAGE, COIL VOLTAGE AND COIL CURRENT SATISFY 3RD CONDITION?
S15 RELAY DRIVE POWER SOURCE VOLTAGE, COIL VOLTAGE AND COIL CURRENT SATISFY 4TH CONDITION?
S16 (2) LATCH RELAY FAULT CONFIRMATION

S17 (3) HARNESS FAULT CONFIRMATION
S200 OPEN-CIRCUIT FAULT OF IC FOR RELAY DRIVE
S201 RELAY DRIVE POWER SOURCE VOLTAGE, COIL VOLTAGE AND COIL CURRENT SATISFY 11TH CONDITION?
S202 RELAY DRIVER POWER SOURCE VOLTAGE MONITOR FAULT
S203 RELAY DRIVE POWER SOURCE VOLTAGE, COIL VOLTAGE AND COIL CURRENT SATISFY 12TH CONDITION?
S204 RELAY COIL VOLTAGE MONITOR FAULT
S205 RELAY DRIVE POWER SOURCE VOLTAGE, COIL VOLTAGE AND COIL CURRENT SATISFY 13TH CONDITION?
S206 RELAY COIL CURRENT MONITOR FAULT
S207 MULTIPLE MONITOR FAULTS
FIG. 11
S23 SET DRIVE
S30 POTENTIAL DIFFERENCE BETWEEN "V_C_C" AND "V_C_D" SATISFIES 5TH CONDITION?
S31 RELAY DRIVE POWER SOURCE VOLTAGE, COIL VOLTAGE AND COIL CURRENT SATISFY 6TH CONDITION?
S32 SET DRIVE NORMAL
S33 RELAY DRIVE POWER SOURCE VOLTAGE, COIL VOLTAGE AND COIL CURRENT SATISFY 7TH CONDITION?
S35 RELAY DRIVE POWER SOURCE VOLTAGE, COIL VOLTAGE AND COIL CURRENT SATISFY 8TH CONDITION?
S36 "V_C" VOLTAGE ("V_C_D") SATISFIES 9TH CONDITION?
S37 DISCHARGE OPERATION
S38 CHARGE OPERATION
S39 POTENTIAL DIFFERENCE BETWEEN "V_C_D" AND "V_C_E" SATISFIES 10TH CONDITION?
S40 (2) LATCH RELAY FAULT CONFIRMATION
S41 (3) HARNESS FAULT CONFIRMATION
S230 OPEN-CIRCUIT FAULT OF IC FOR RELAY DRIVE
S231 RELAY DRIVE POWER SOURCE VOLTAGE, COIL VOLTAGE AND COIL CURRENT SATISFY 14TH CONDITION?
S232 RELAY DRIVER POWER SOURCE VOLTAGE MONITOR FAULT
S233 RELAY DRIVE POWER SOURCE VOLTAGE, COIL VOLTAGE AND COIL CURRENT SATISFY 15TH CONDITION?
S234 RELAY COIL VOLTAGE MONITOR FAULT
S235 RELAY DRIVE POWER SOURCE VOLTAGE, COIL VOLTAGE AND COIL CURRENT SATISFY 16TH CONDITION?
S236 RELAY COIL CURRENT MONITOR FAULT
S237 MULTIPLE MONITOR FAULTS

The invention claimed is:

1. A charge/discharge device comprising:
a charge/discharge circuit connected to a circuit that includes an electrical storage unit and a relay that is connected to the electrical storage unit and switches between an ON state and an OFF state that respectively allow and disallow charging/discharging of the electrical storage unit, the relay switching between the OFF state and the ON state in response to a drive current being provided, and configured to perform a charge operation for charging the electrical storage unit in response to a charge instruction and a discharge operation for discharging the electrical storage unit in response to a discharge instruction;
a drive circuit having a configuration to which a power source voltage is input, and configured to generate the drive current based on the power source voltage in a case where a predetermined drive instruction is given, and to supply the drive current to the relay;
a control unit configured to control the charge instruction and the discharge instruction that are given to the charge/discharge circuit and the drive instruction that is given to the drive circuit; and
an anomaly specification unit configured to specify a portion in which an anomaly has occurred based on the power source voltage that is input to the drive circuit, output that is provided to the relay from the drive circuit, and a voltage of a charge/discharge path that is interposed between the charge/discharge circuit and the electrical storage unit.

2. The charge/discharge device according to claim 1, wherein the anomaly specification unit specifies, based on the power source voltage that is input to the drive circuit and the output that is provided to the relay from the drive circuit during a period in which the drive instruction is being given to the drive circuit or during a period in which the drive instruction is not being given to the drive circuit, whether the portion in which the anomaly has occurred is the drive circuit or a portion other than the drive circuit.

3. The charge/discharge device according to claim 1, wherein the anomaly specification unit judges whether at least one of a current and a voltage that is provided to the relay during a period in which the drive instruction is being given exceeds a threshold value, and judges, based on a judgment result of whether the threshold value has been exceeded and a voltage of the charge/discharge path, whether the portion in which the anomaly has occurred is the relay.

4. The charge/discharge device according to claim 1, wherein the anomaly specification unit judges, based on the power source voltage that is input to the drive circuit, whether the portion in which the anomaly has occurred is a circuit that inputs the power source voltage.

5. The charge/discharge device according to claim 1, wherein, on the charge/discharge path connected to the electrical storage unit, a capacitor having a smaller capacitance than the electrical storage unit is connected in parallel to the electrical storage unit,
the anomaly specification unit determines, in a case where the charge operation or the discharge operation is performed by the charge/discharge circuit during the period in which an instruction for setting the relay to the OFF state is being given to the drive circuit from the control unit, whether the voltage of the charge/discharge path has changed in excess of a predetermined potential difference during the charge operation or the discharge operation, and specifies the portion in which the anomaly has occurred, based on a judgment result of whether the voltage of the charge/discharge path has changed in excess of the predetermined potential difference, the power source voltage that is input to the drive circuit, and the output that is provided to the relay.

6. The charge/discharge device according to claim 1, wherein the relay is a latching relay that holds a set state in response to a first drive current flowing to a first conduction path, and holds a reset state in response to a second drive current flowing to a second conduction path, and the drive circuit has a configuration that sends the first drive current to the relay in a case where the first drive instruction is given as the drive instruction, and sends the second drive current to the relay in a case where the second drive instruction is given as the drive instruction, the control unit has a configuration that controls the first drive instruction and the second drive instruction that are given to the drive circuit, and the anomaly specification unit specifies the portion in which the anomaly has occurred at a time of a drive for holding the set state, based on the power source voltage, the output that is provided to the relay from the drive circuit at least in the period in which the first drive instruction is given by the control unit and the voltage of the charge/discharge path, and specifies the portion in which the anomaly has occurred at a time of a drive for holding the reset state, based on the output that is provided to the relay from the drive circuit at least in the period in which the second drive instruction is given by the control unit and the voltage of the charge/discharge path.

\* \* \* \* \*